United States Patent [19]

Iwahashi et al.

[11] Patent Number: 4,959,816

[45] Date of Patent: Sep. 25, 1990

[54] SEMICONDUCTOR INTEGRATED CIRCUIT

[75] Inventors: Hiroshi Iwahashi, Yokohama; Hideo Kato, Kawasaki; Yuuichi Tatsumi, Tokyo, all of Japan

[73] Assignee: Kabushiki Kaisha Toshiba, Kawasaki, Japan

[21] Appl. No.: 290,721

[22] Filed: Dec. 27, 1988

[30] Foreign Application Priority Data

Dec. 28, 1987 [JP] Japan .................................. 62-330056
Oct. 7, 1988 [JP] Japan .................................. 63-252971
Nov. 18, 1988 [JP] Japan .................................. 63-291969

[51] Int. Cl.$^5$ ............................................. G11C 7/00
[52] U.S. Cl. .............................. 365/233.5; 365/189.05; 365/230.08
[58] Field of Search ................ 365/233, 233.5, 230.08, 365/189.05, 210

[56] References Cited

U.S. PATENT DOCUMENTS

| | | | |
|---|---|---|---|
| 4,573,147 | 2/1986 | Aoyama et al. | 365/233.5 |
| 4,701,889 | 10/1987 | Ando | 365/233.5 |
| 4,707,809 | 11/1987 | Ando | 365/233.5 |
| 4,827,454 | 5/1989 | Okazaki | 365/233.5 |

OTHER PUBLICATIONS

IEEE Journal of Solid-State Circuits, vol. SC-22, No. 5, Oct. 1987, T. Wada, et al., "A 34-ns 1-Mbit CMOS SRAM Using Triple Polysilicon", pp. 727-732.

Primary Examiner—Joseph A. Popek
Attorney, Agent, or Firm—Finnegan, Henderson, Farabow, Garrett, and Dunner

[57] ABSTRACT

A data transfer control circuit is connected between a sense amplifier and output buffer circuit. The data transfer control circuit is controlled by a pulse signal supplied from a pulse signal generator so as to have longer delay time which pulse signal is not generated by the pulse signal generator, and operate as noise canceller and prevents from outputting erroneous signal therefrom to the output buffer circuit.

51 Claims, 31 Drawing Sheets

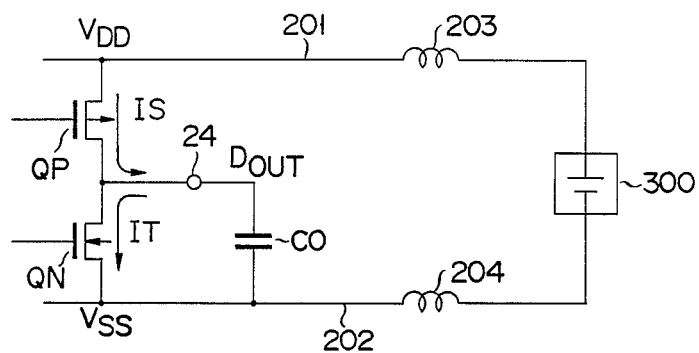
F I G. 2
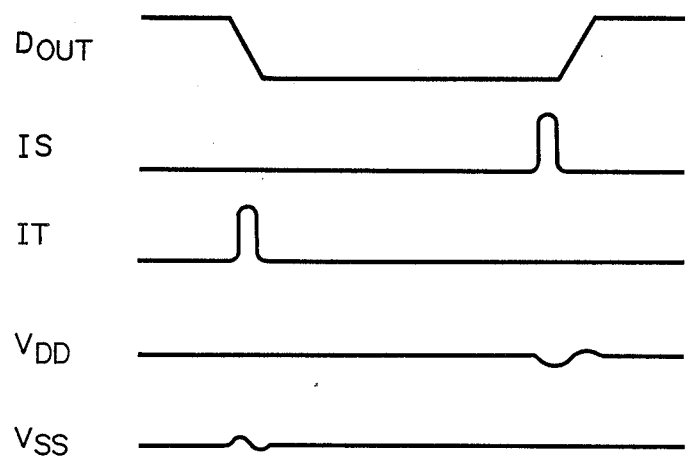
F I G. 3

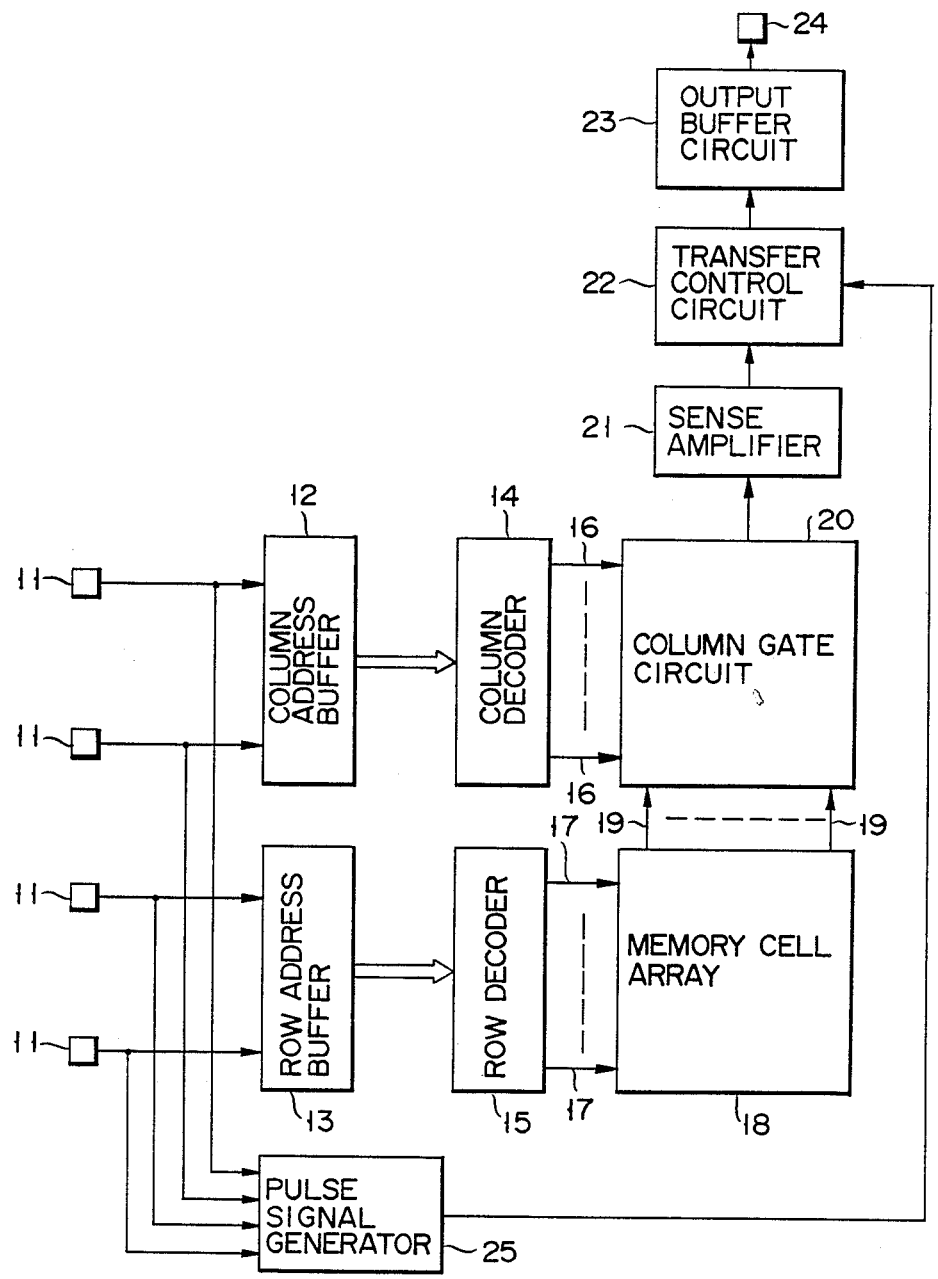
F I G. 4

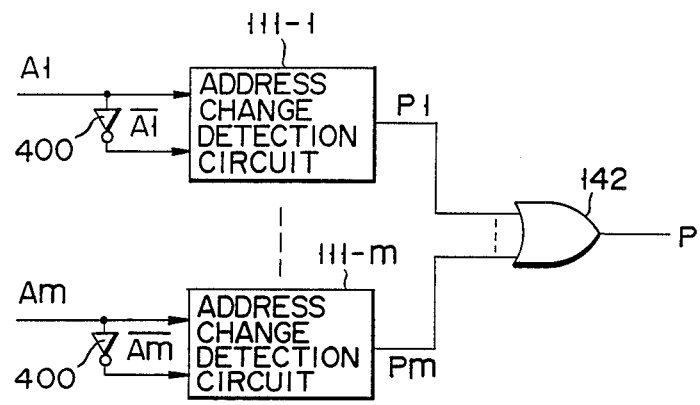
F I G. 10

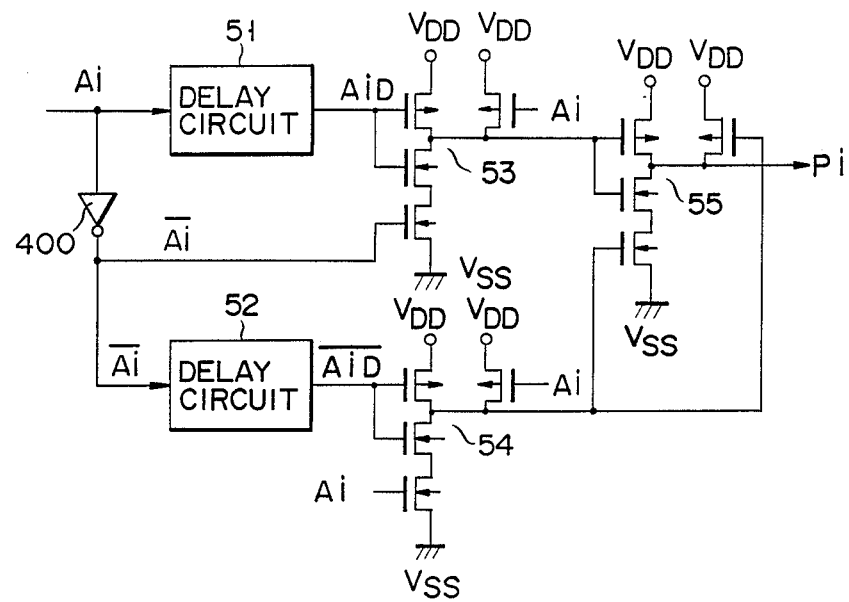
F I G. 11
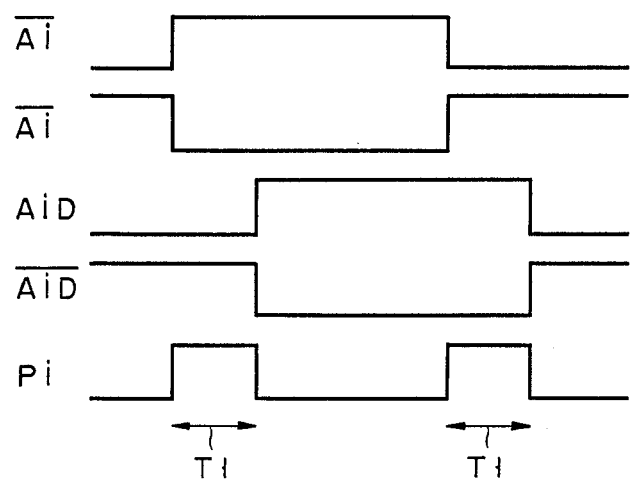
F I G. 12

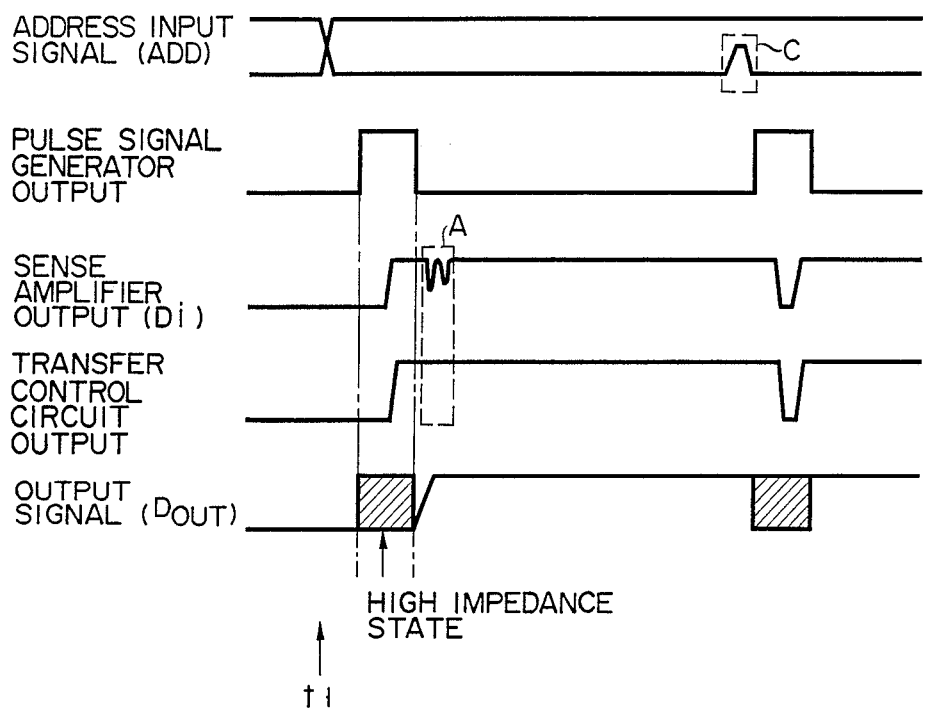
F I G. 14

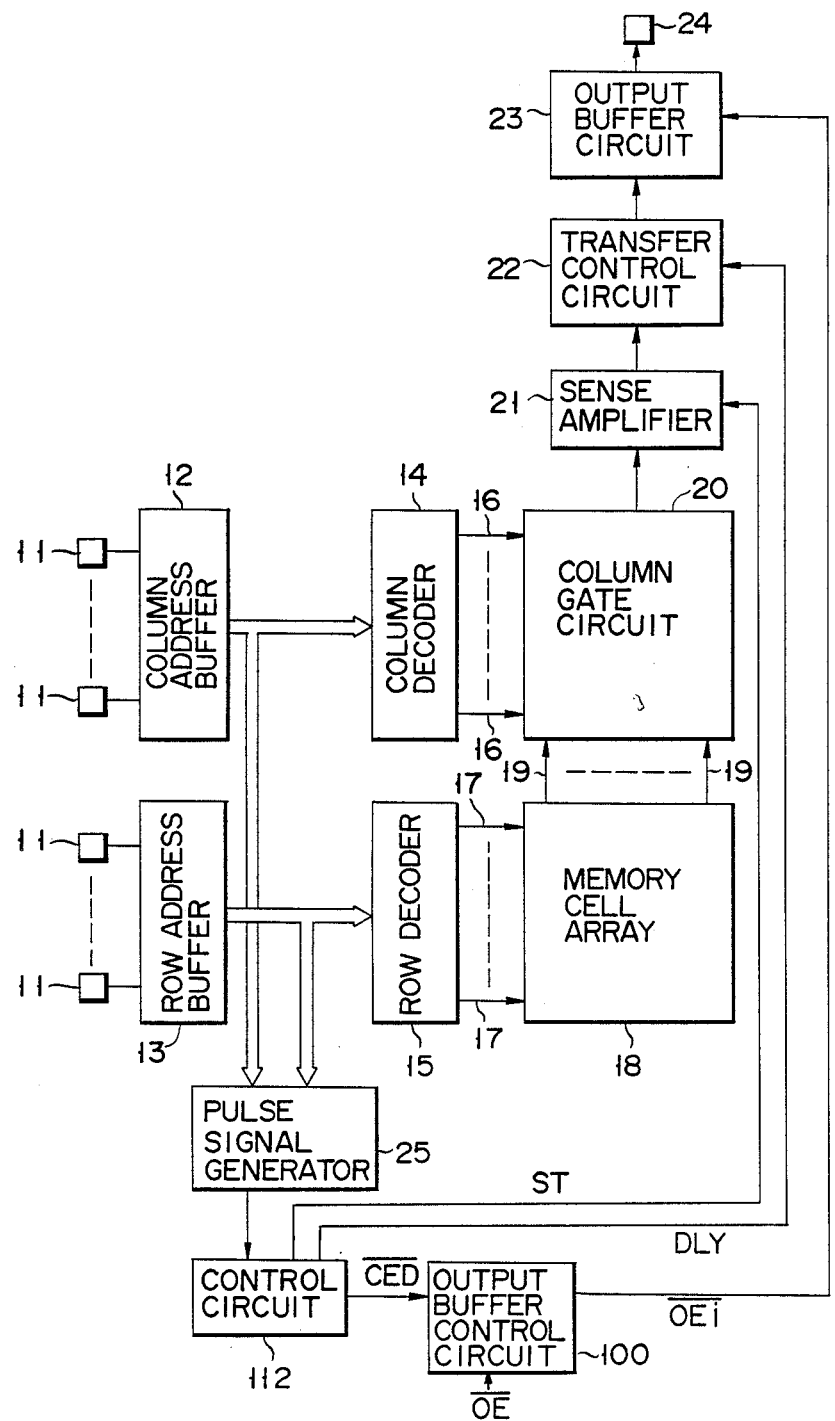
F I G. 18

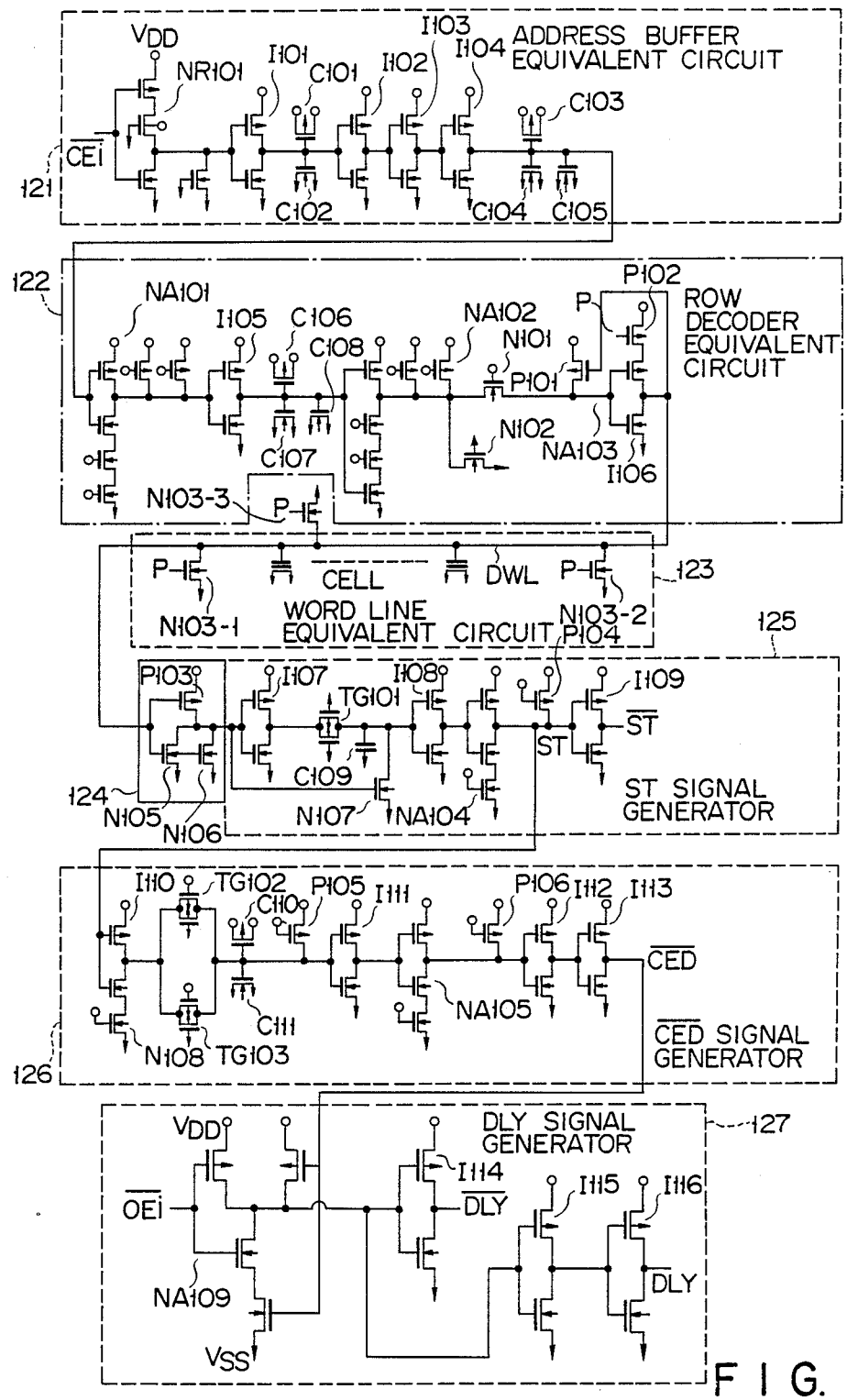
F I G. 20

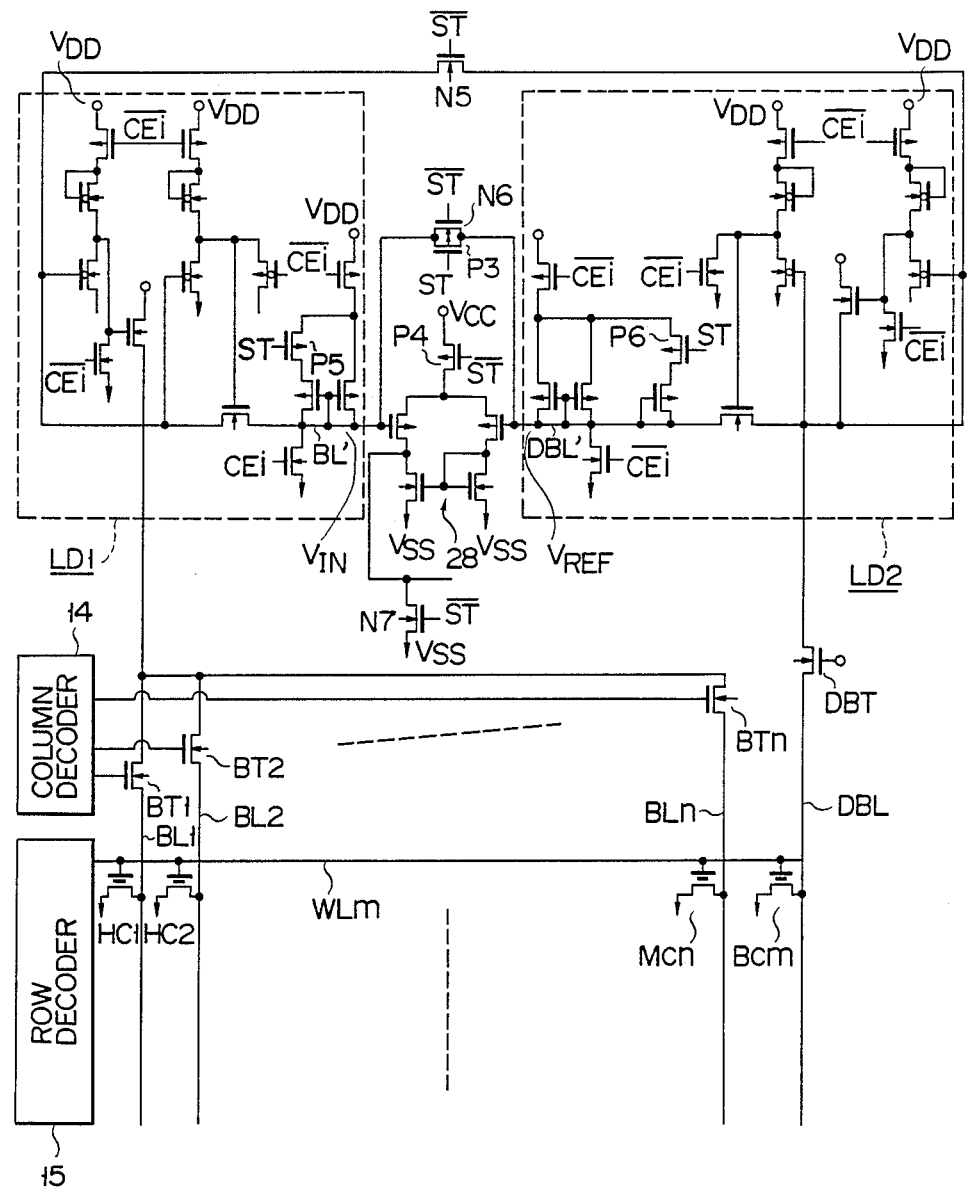
F I G. 21

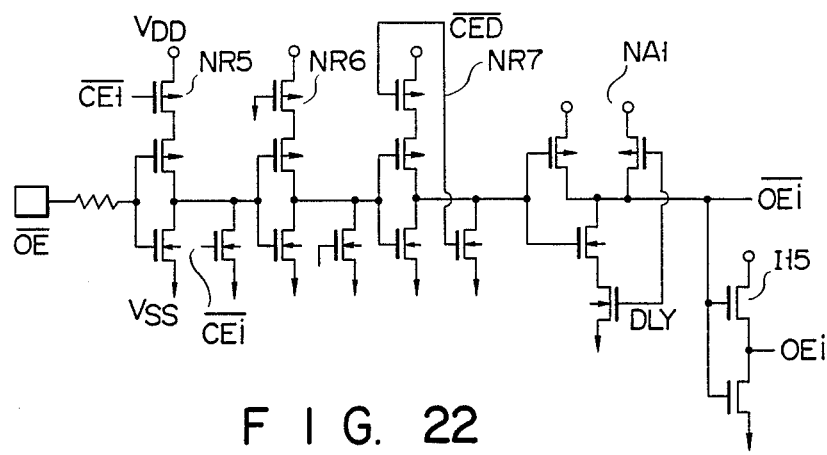
F I G. 22
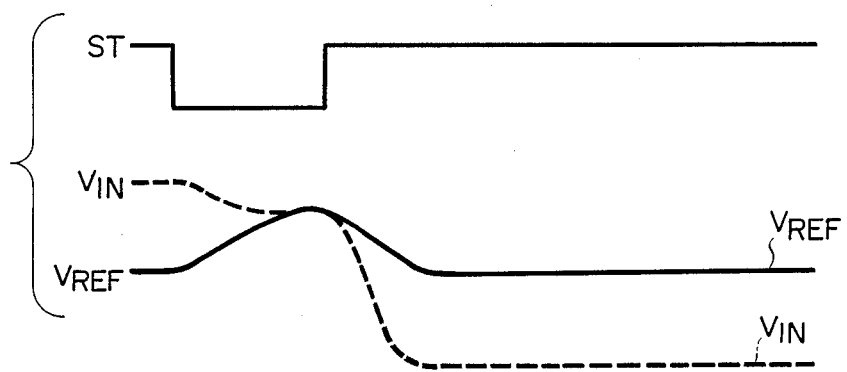
F I G. 23A
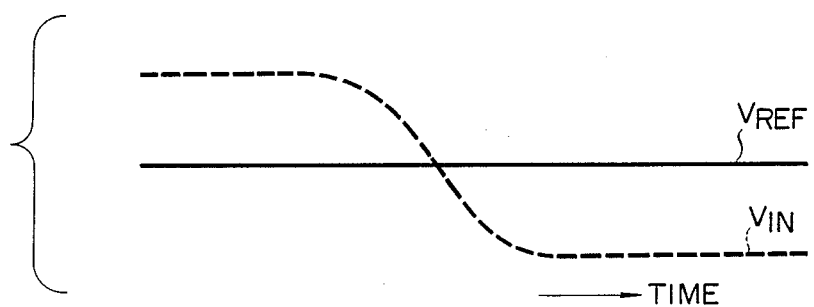
F I G. 23B

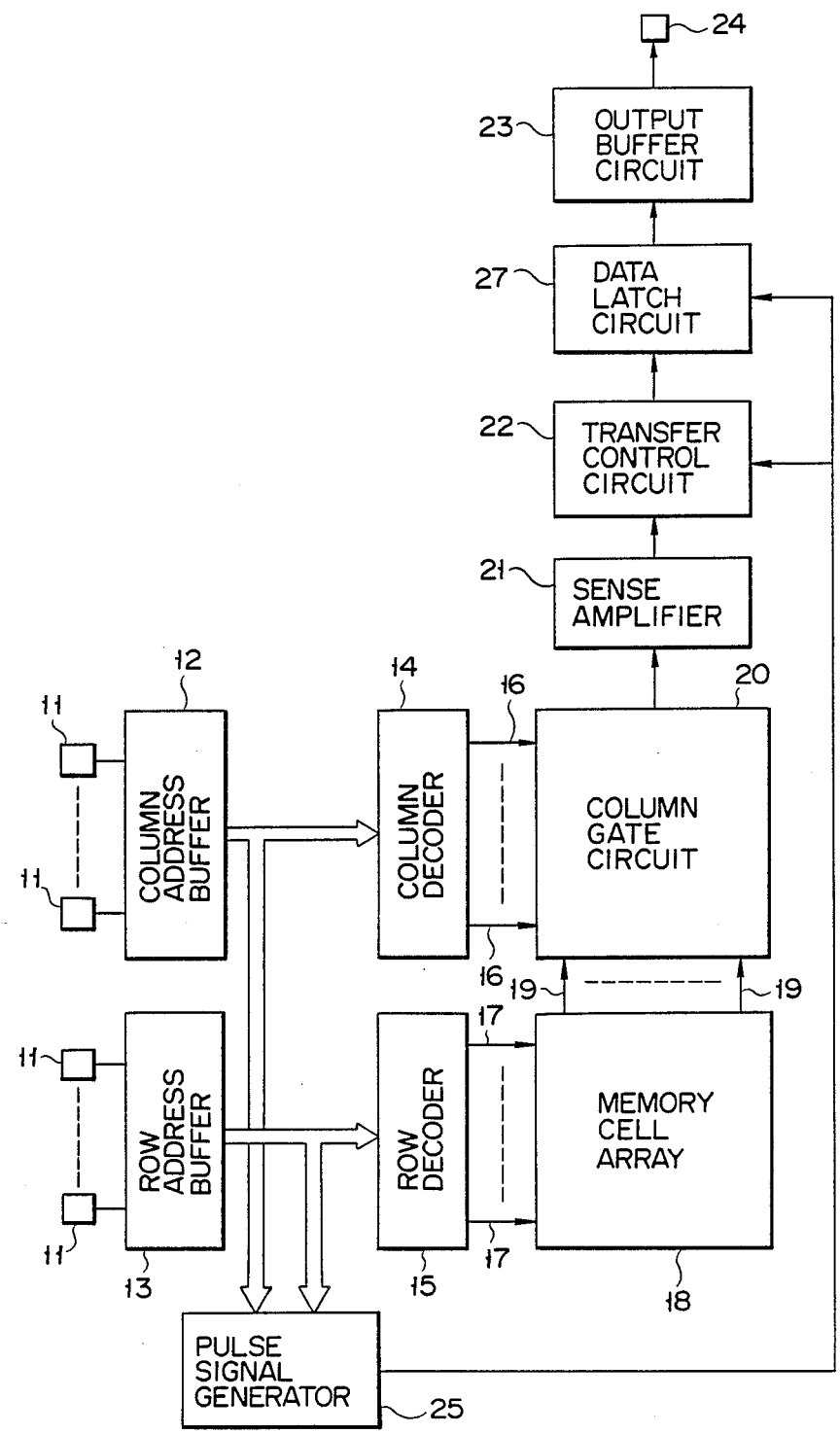
F I G. 24

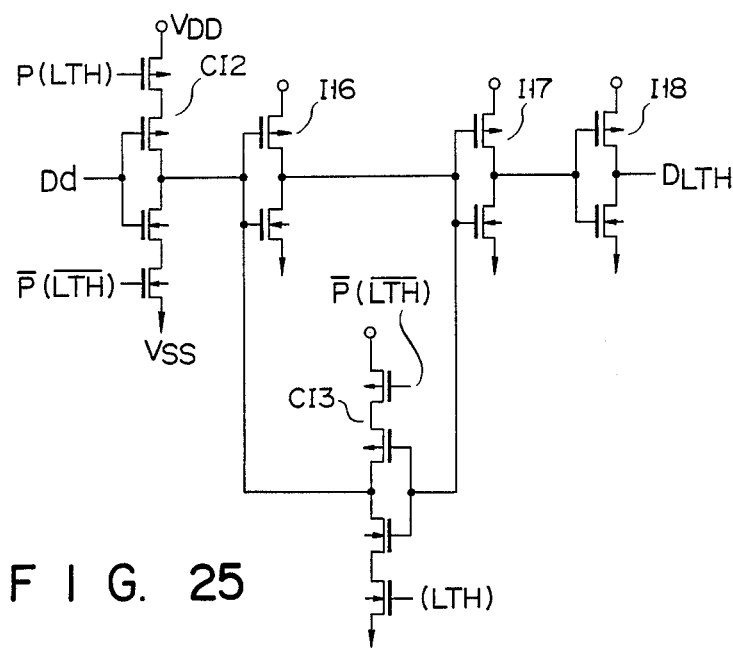
F I G. 25
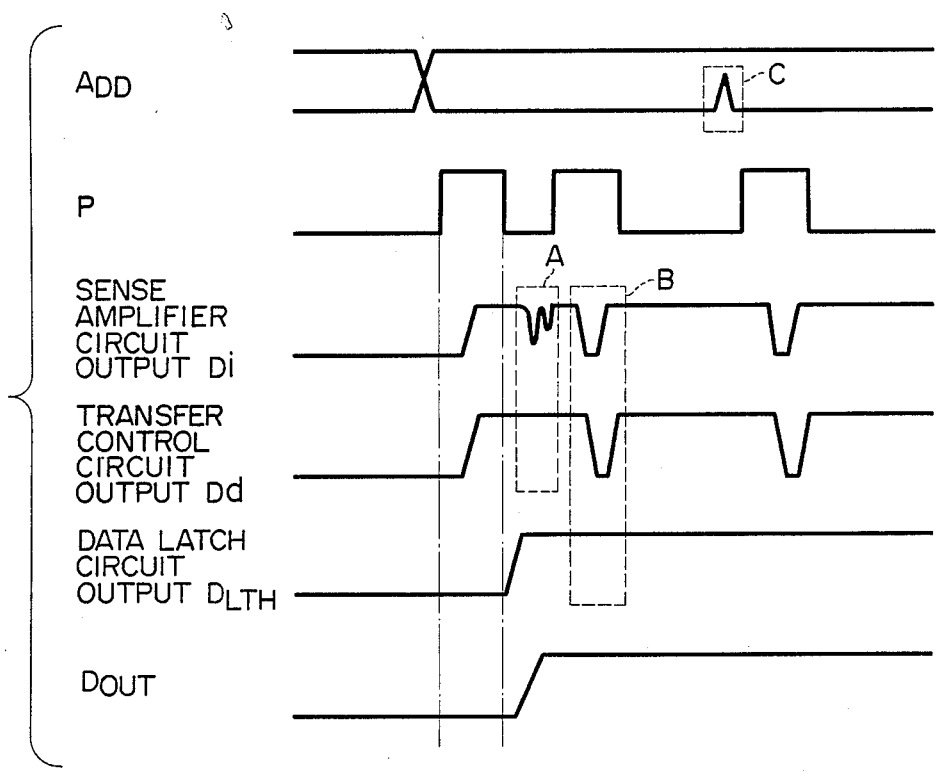
F I G. 26

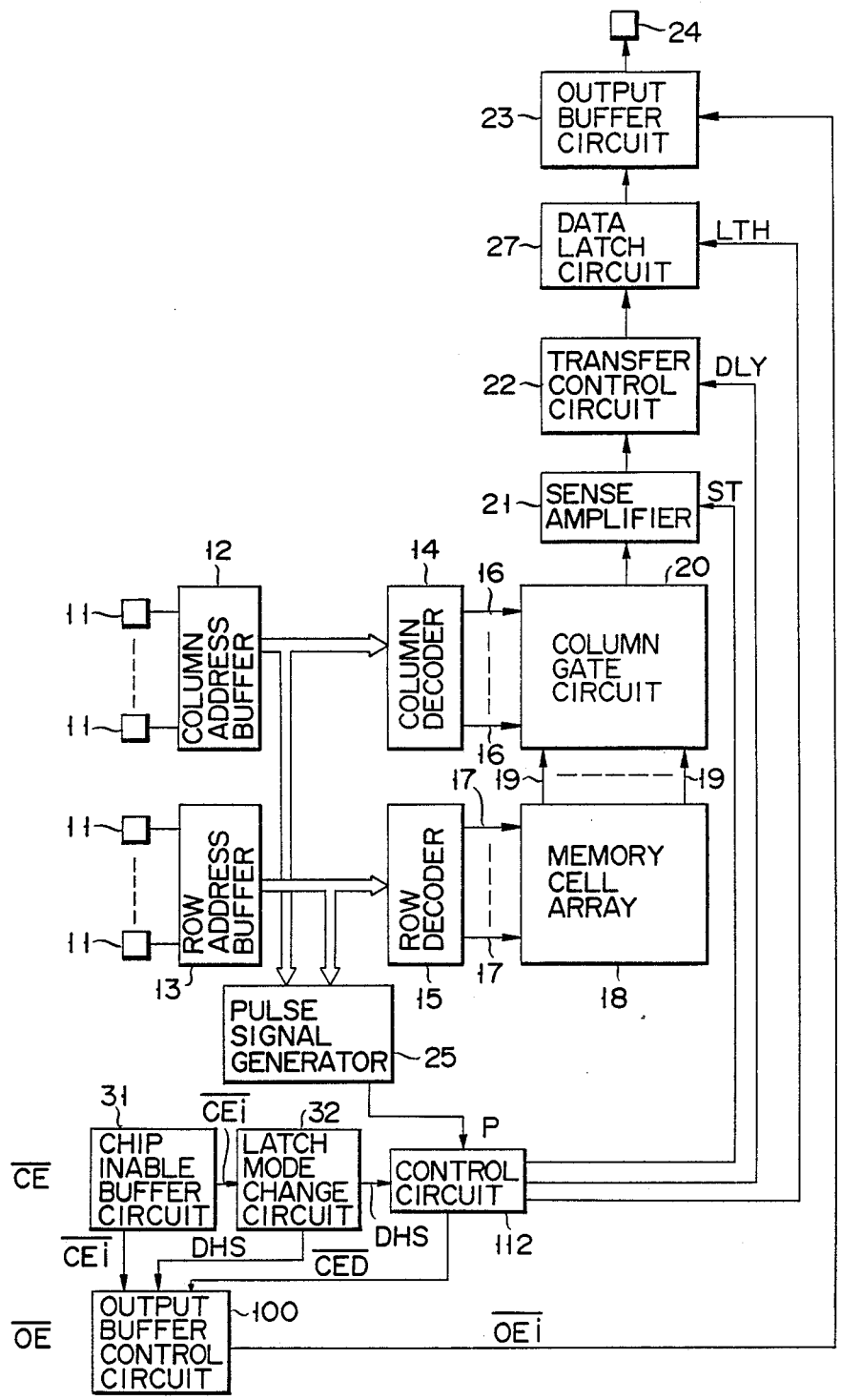
F I G. 27

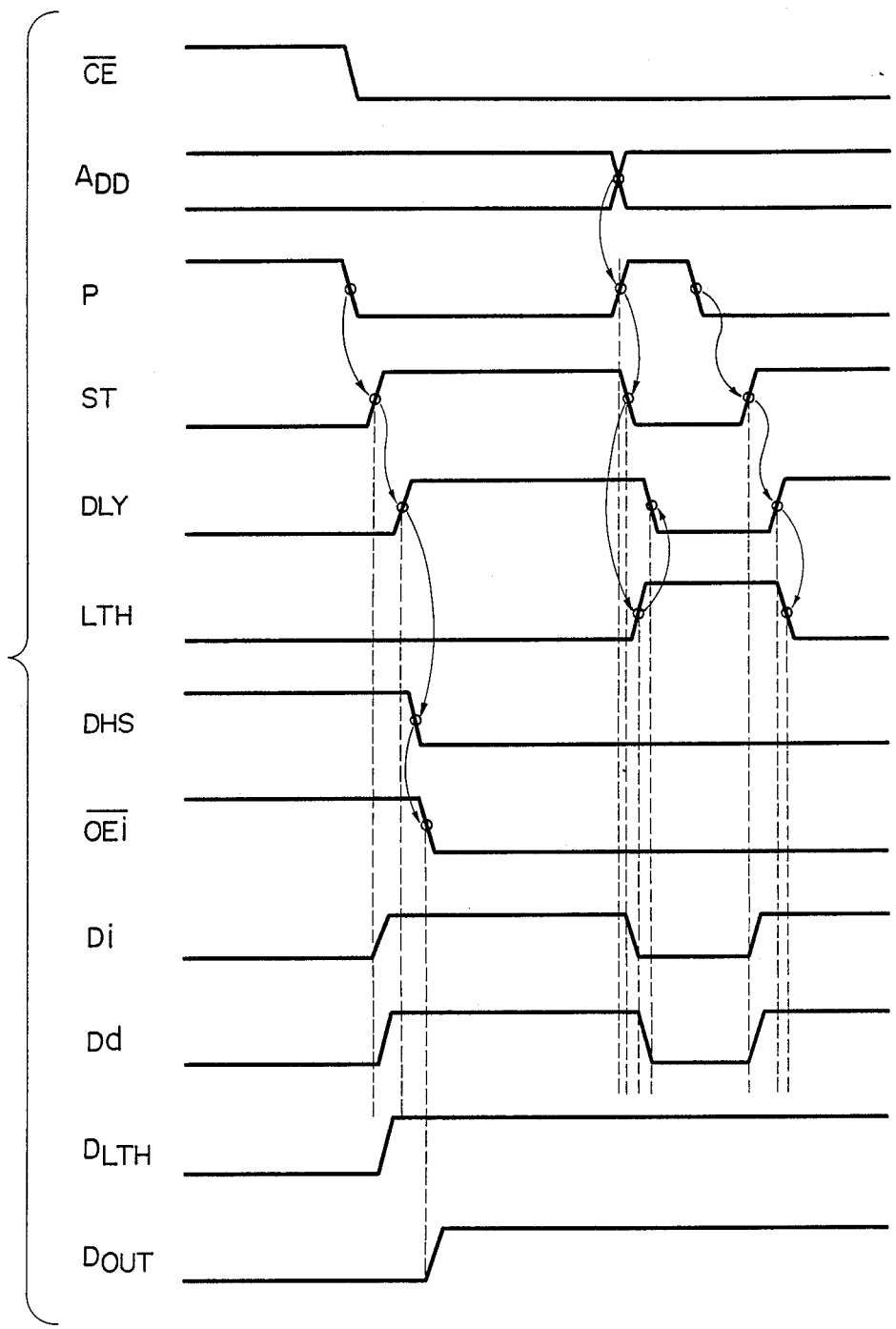
F I G. 31

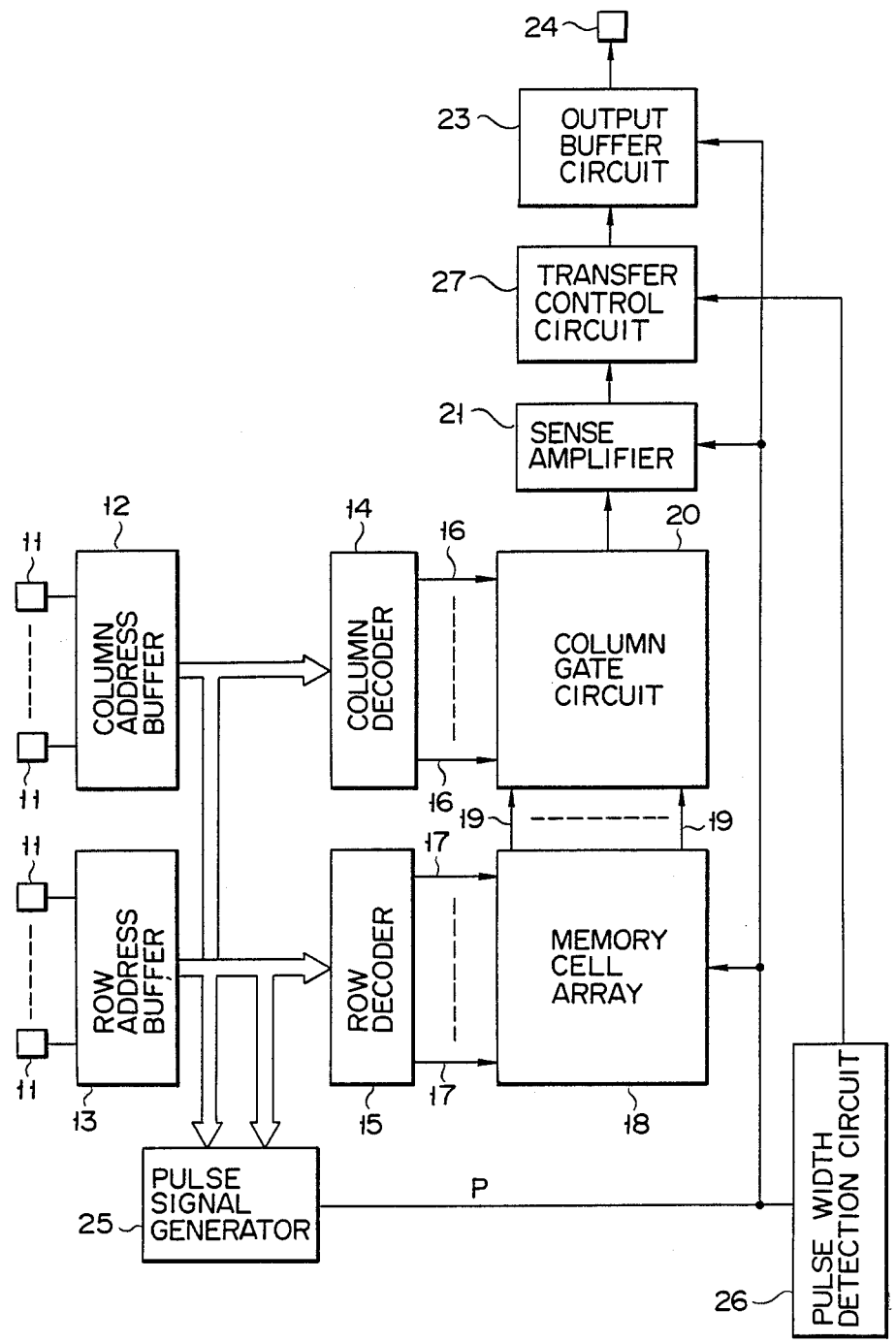
F I G. 32

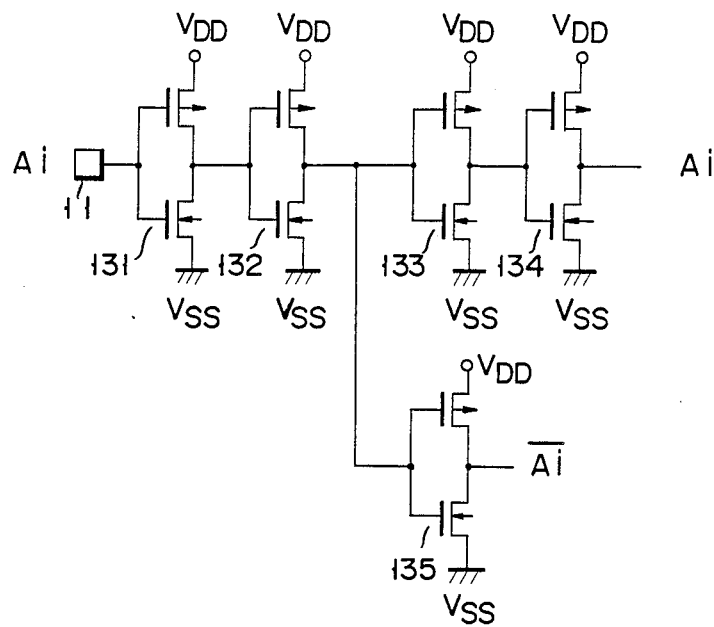
F I G. 33

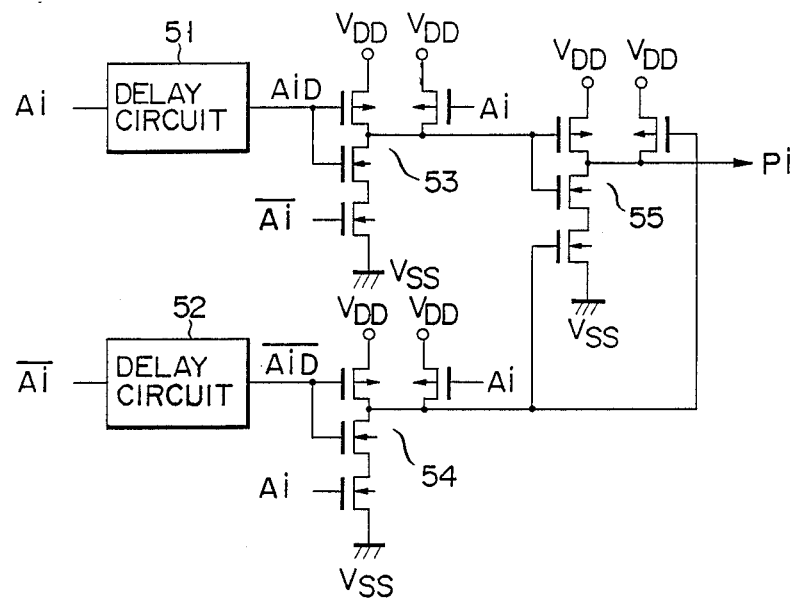
F I G. 34
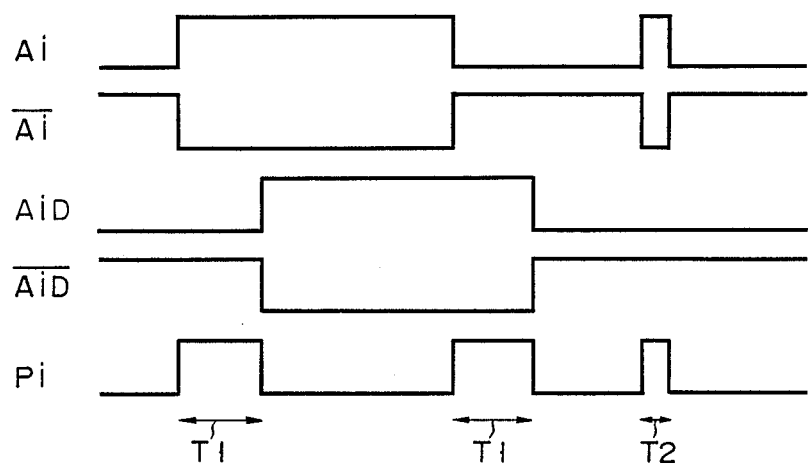
F I G. 35

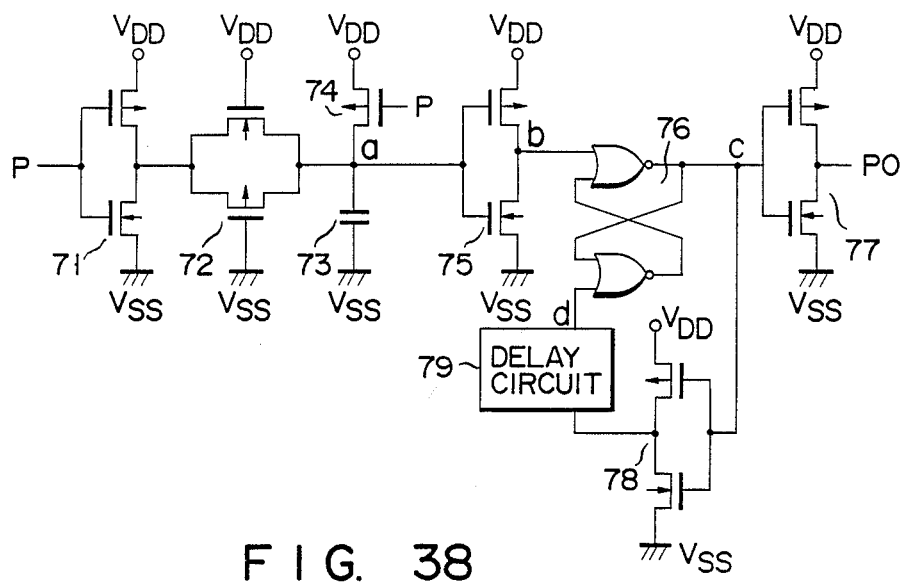
F I G. 38
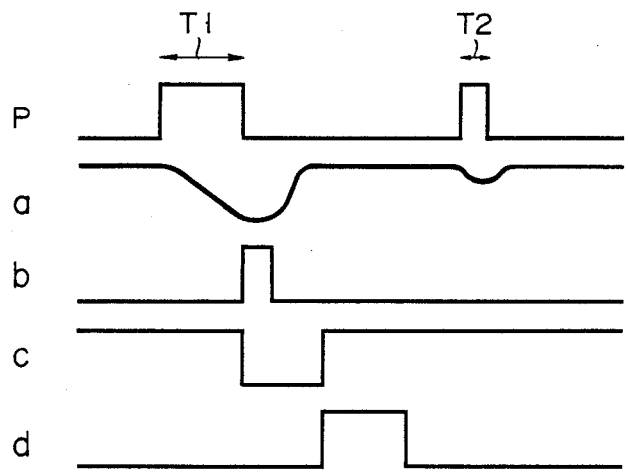
F I G. 39

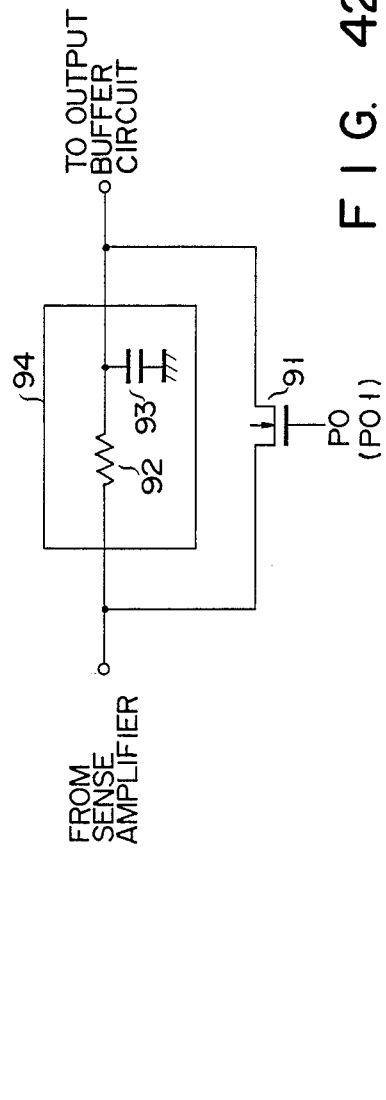
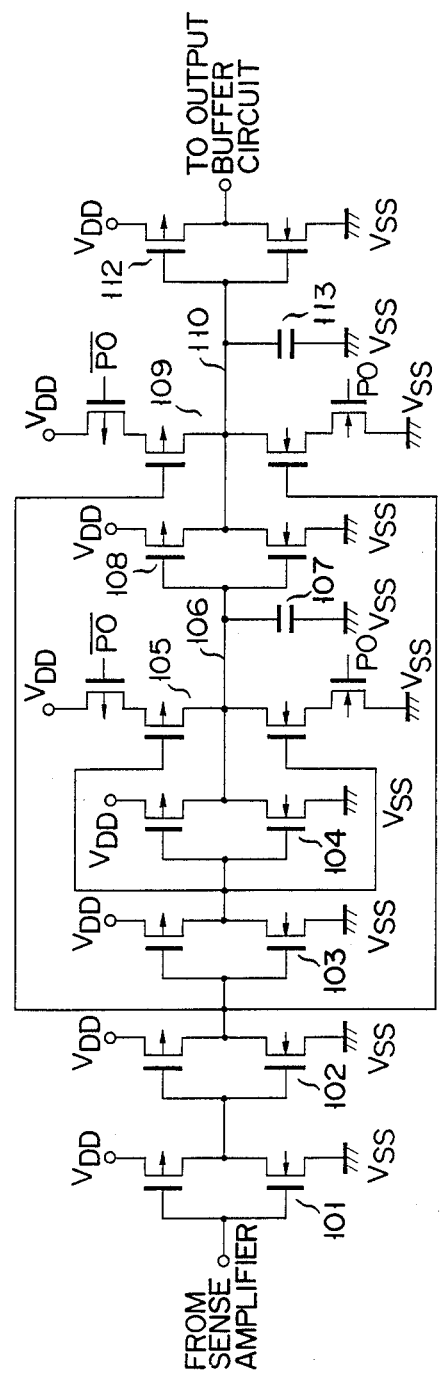
F I G. 42
F I G. 43

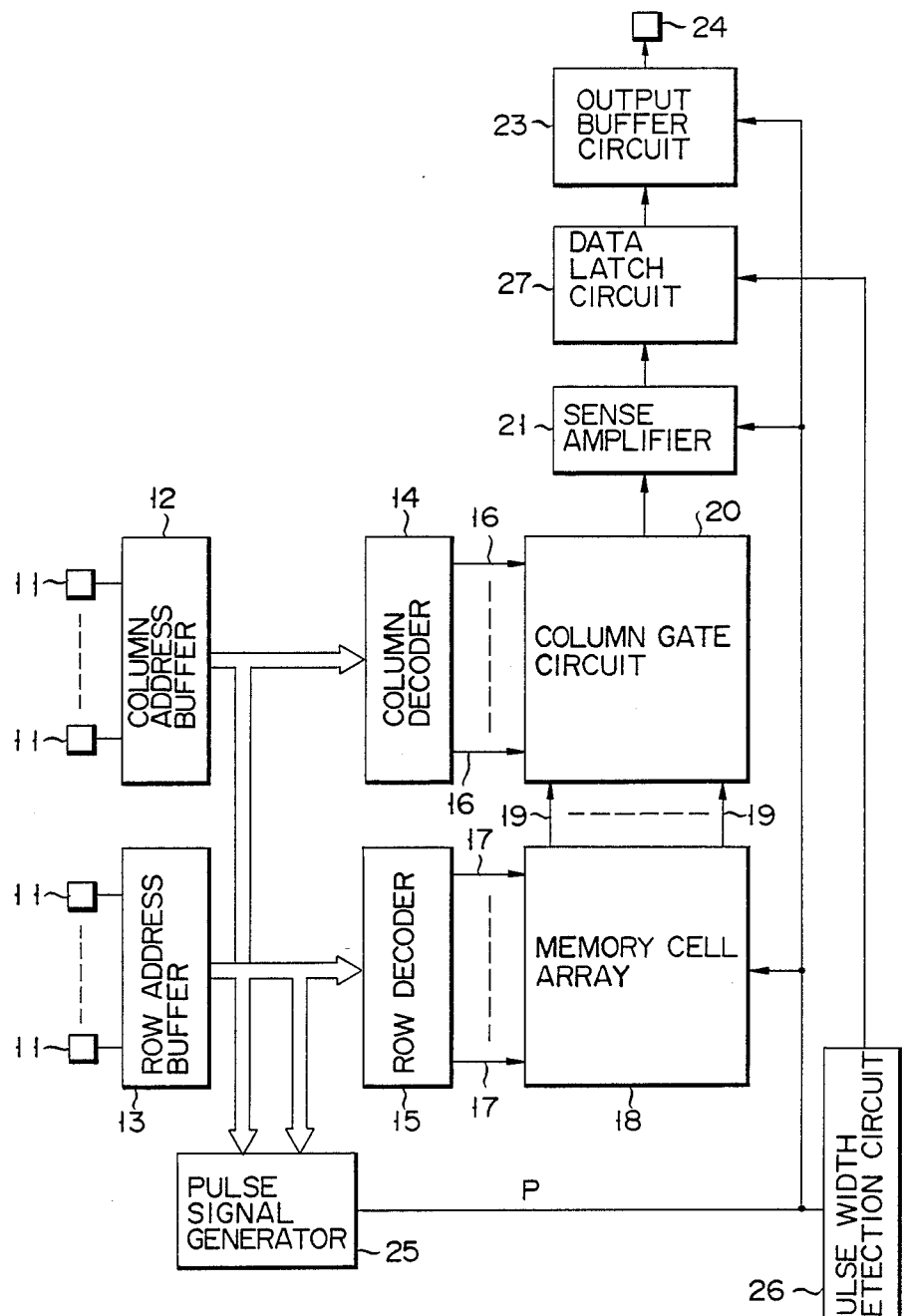
F I G. 44

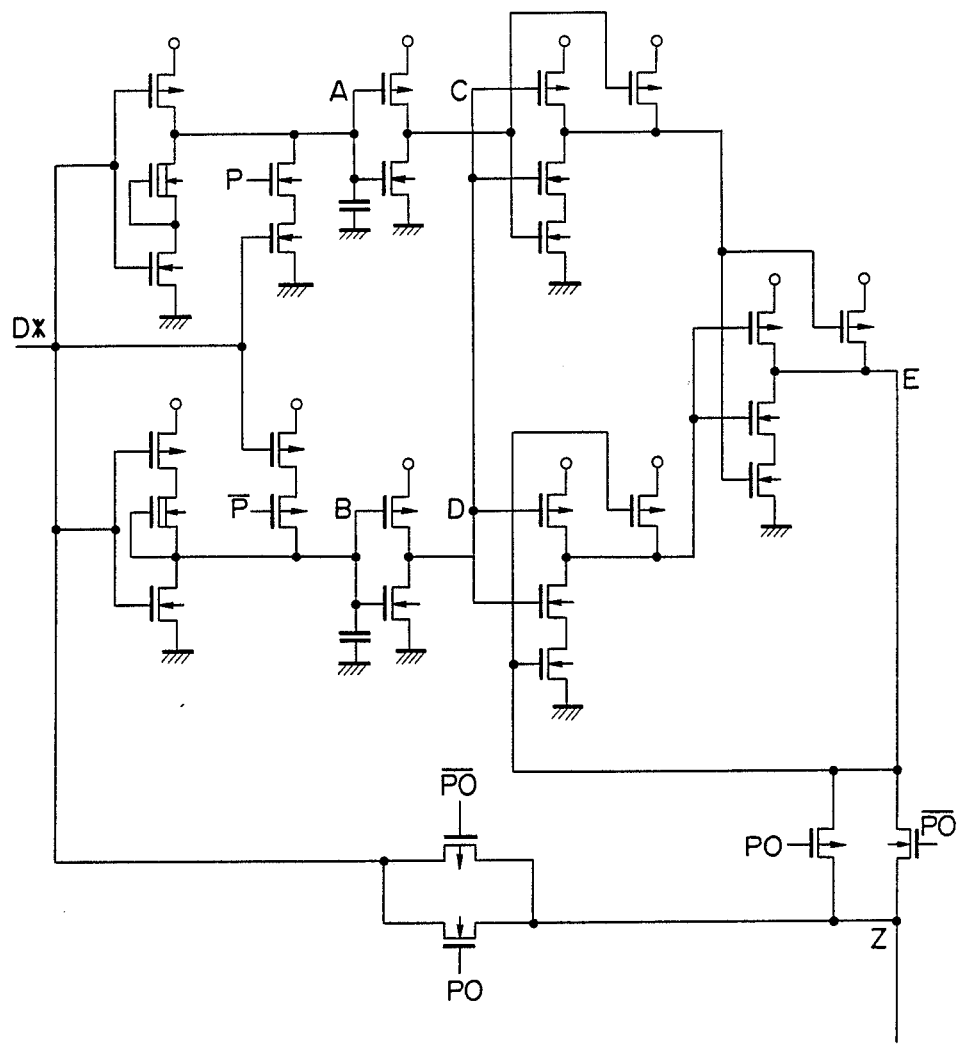
F I G. 45

SEMICONDUCTOR INTEGRATED CIRCUIT

BACKGROUND OF THE INVENTION

1. Field of the Invention

The present invention relates to a semiconductor integrated circuit (IC) and, more particularly, to a semiconductor memory having an output buffer circuit through which a large current flows.

2. Description of the Related Art

There is a demand for higher processing speed of a semiconductor integrated circuit. For example, in a semiconductor memory, a fast access time and a decrease in power consumption become important subjects.

FIG. 1 is a block diagram showing a conventional random access memory (RAM) in which an operation of an internal circuit is controlled by a pulse signal. This pulse signal is generated in synchronism with a change of an address input signal. A fast access time and a decrease in power consumption are attempted by using the pulse signal. In this case, in order to simplify a description, a circuit portion associated with data writing is omitted. Referring to FIG. 1, reference numerals 11 denote a plurality of address input terminals; 12, a column address buffer; 13, a row address buffer; 14, a column decoder; 15, a row decoder; 16, column selection lines; 17, row lines: 18, a memory cell array having a plurality of memory cells (not shown) in a matrix form to be selected by signals through row lines 17; 19, bit lines; 20, a column gate circuit; 21, a sense amplifier; 23, an output buffer circuit; 24, a data output terminal; and 25, a pulse signal generator.

Column and row address buffers 12 and 13 respectively generate internal address signals corresponding to column and row address input signals externally supplied from circuits outside the memory. Pulse signal generator 25 receives the internal address signals output from column and row address buffers 12 and 13, and outputs a pulse signal when the logic level of at least one of the address signals is changed. The pulse signal output from pulse signal generator 25 is supplied to memory cell array 18, sense amplifier 21, and output buffer circuit 23. Operation of memory cell array 18, sense amplifier 21, and output buffer circuit 23 are controlled by this pulse signal. For example, a precharge operation of each bit line in memory cell array 18, a sensing operation of data in sense amplifier 21, and an output operation of data in output buffer circuit 23 are respectively controlled by this pulse signal. The above pulse signal is set to have a pulse width wide enough to allow memory cell array 18, sense amplifier 21, and output buffer circuit 23 to be operated with a sufficient margin.

In a semiconductor memory, a large capacitance connected to a data output terminal e.g., a load capacitor of about 100 pF, must be driven by an output buffer circuit. For this reason, in the output buffer circuit, the current driving ability of a transistor on an output stage is very large so as to satisfactorily drive such a large load capacitor.

FIG. 2 shows an arrangement of the output stage of such an output buffer circuit. The output stage of the output buffer circuit is constituted by p-channel MOS transistor Qp having the source connected to positive power source voltage $V_{DD}$ and the drain connected to data output terminal 24, and n-channel MOS transistor Qn having the source connected to $V_{SS}$ (ground) and the drain connected to output terminal 24. One of transistors Qp and Qn is set in an ON state according to data detected by sense amplifier 21. Load capacitor Co connected to data output terminal 24 is charged toward $V_{DD}$ or discharged to $V_{SS}$ through the ON-state transistor. The conductances of both transistors are set to be large so as to enable outputting quickly data Dout from output terminal 24 by performing charging and discharging of capacitor Co using a large current.

Power source voltage $V_{DD}$ and ground voltage $V_{SS}$ are applied from power source unit 200 to this output buffer circuit through wiring lines 201 and 202. With this arrangement, when a large current flows through lines 201 and 202, voltages $V_{DD}$ and $V_{SS}$ greatly vary due to the influences of inductances 203 and 204 present on lines 201 and 202. More specifically, if the value of each of inductances 203 and 204 is set to be L, and a rate of change in current flowing through line 201 or 202 as a function of time is defined as di/dt, potential change $\Delta v$ occurring at line 201 or 202 can be given by the following equation:

$$\Delta v = L \cdot (di/dt) \qquad 1$$

FIG. 3 is a timing chart showing a voltage/current change at each node in the circuit shown in FIG. 2. Referring to FIG. 3, reference symbol Is denotes a drain current of p-channel MOS transistor Qp; and It, a drain current of n-channel MOS transistor Qn. When transistors Qp and Qn are switched, and drain current Is or It of transistor Qp or Qn flows, voltages $V_{DD}$ and $V_{SS}$ vary, as shown in FIG. 3.

If a large current flows through the output stage when data is output from the output buffer circuit in this manner, voltages $V_{DD}$ and $V_{SS}$ supplied to semiconductor memory vary. An operation error of the semiconductor memory is occurred by these potential changes. An operation error caused by charging and discharging currents with respect to a load capacitor tends to be more easily caused as a semiconductor memory is required to be operated at a higher speed, and charging and discharging of the load capacitor are performed for a shorter period of time.

Various operation errors are caused by such a variation in power source voltage. One of the operation errors is associated with a sense amplifier. Normally, the sense amplifier detects a very small potential change in a semiconductor memory so as to accomplish a fast access time. However, since power source voltage $V_{DD}$ and ground voltage $V_{SS}$ equivalent to those applied to the output buffer circuit are applied to the sense amplifier, an operation error of the sense amplifier is caused by variation of $V_{DD}$ and $V_{SS}$ voltages. The sense amplifier compares potentials at two input nodes connected to a pair of bit lines, and detects a binary "1" — or "0". In this case, the response speeds of the potentials at the two nodes with respect to the variation in voltage $V_{DD}$ or $V_{SS}$ differ from each other due to a difference between parasitic capacitance of the two nodes. For this reason, a relationship in magnitude between the potentials at the two input nodes is temporarily inverted. As a result, erroneous data may be detected. Such an operation error tends to occur as a difference between the potentials at the two input nodes of the sense amplifier is small. In order to provide a high speed of operation, such a potential difference is preferably set to be minimum. Therefore, such an operation error tends to more easily occur in a semiconductor memory required to be operated at a high speed. In addition, variations of voltages $V_{DD}$ and $V_{SS}$ in a semiconductor memory induce an operation error of an input stage, e.g., a column or row address buffer.

Thus, the changes of the voltages $V_{DD}$ and $V_{SS}$ occur in a semiconductor memory device when data is read out from the output buffer circuit. The potential level of the data supplied to the address input section of the memory device from another semiconductor integrated circuit does not change, even if the voltage $V_{DD}$ or $V_{SS}$ of the semiconductor integrated circuit is changed. As a result, an error occurs in the semiconductor memory device.

For example, if the voltage $V_{SS}$ in the semiconductor memory device changes to the negative direction, while data of a logic "0" level is supplied to the address data input section, the address data input section will recognize the input data as a logic "1" data, since the potential difference between the input data and the voltage $V_{SS}$ becomes large.

That is, if the column or row address buffer operates erroneously, an output from the column or row address buffer is temporarily inverted by the variations in voltages $V_{DD}$ and $V_{SS}$. As a result, pulse signal generator 25 outputs a pulse signal in the same manner as in a normal change in address input. Thus, memory cell array 18, sense amplifier 21, and output buffer circuit 23 receive this pulse signal and hence start the respective operations in the same manner as in a normal change in address input. Thereafter, undesired data is output from output buffer circuit 23, and an operation error occurs.

As described above, in the conventional semiconductor IC, the change of a power source voltage is generated when the output buffer circuit outputs a data, and an operation error tends to be caused by this change of a power source voltage.

SUMMARY OF THE INVENTION

The present invention has been made to solve a problem that an operation error is caused in an internal circuit of an IC upon power source variation during a change in output data or upon external noise input, and this operation error causes an output buffer to output erroneous data. It is, therefore, an object of the present invention to provide a highly reliable semiconductor IC, which can prevent an operation error in an internal circuit of an IC due to a source voltage variation during a change in output data, or external noise input. As the driving ability of an output-stage transistor of the output buffer circuit can large, a fast access time is maintained.

According to the present invention, a semiconductor integrated circuit comprises data storage means, pulse signal generating means for generating a pulse signal by detecting a change of a address input signal, data detecting means for detecting data stored in the data storage means corresponding to the address input, data transfer control means connected to the data detecting means, data output means for externally outputting the data detected by the data detecting means, the data transfer control means being controlled so as to have longer delay time while the pulse signal is not generated by the pulse signal generator, and operating as a noise canceller to prevent the outputting of an erroneous signal therefrom to the data outputting means.

BRIEF DESCRIPTION OF THE DRAWINGS

FIG. 2 is a circuit diagram showing an output buffer circuit of the semiconductor memory in FIG. 1;

FIG. 3 is a timing chart showing voltage/current changes at a node of each part of the output buffer circuit in FIG 2;

FIG. 4 is a block diagram showing a semiconductor memory according to the present invention;

FIG. 10 is a circuit diagram showing a detailed arrangement of a pulse signal generator in the semiconductor memory of the present invention in FIG. 4;

FIG. 11 is a circuit diagram showing a detailed arrangement of an address change detection circuit in the pulse signal generator in FIG. 10;

FIG. 12 is a timing chart for explaining an operation of the address change detection circuit in FIG. 11;

FIG. 14 is a timing chart for explaining an operation of the semiconductor memory in FIG. 13;

FIG. 18 is a block diagram showing a semiconductor memory according to still another embodiment of the present invention;

FIG. 20 is a circuit diagram showing a detailed arrangement of a control circuit in the semiconductor memory of in FIG. 18;

FIG. 21 is a circuit diagram showing a detailed arrangement of a memory cell array, a column selection gate, and a sense amplifier in the semiconductor memory of the present invention in FIG. 18;

FIG. 22 is a circuit diagram showing a detailed arrangement of an output buffer control circuit in the semiconductor memory of the present invention in FIG. 18;

FIG. 23A is a waveform chart showing an operation waveform of the sense amplifier in FIG. 21;

FIG. 23B is a waveform chart showing an operation waveform of the sense amplifier in FIG. 21 without using transistors N5, N6, P3, P5, and P6 shown in FIG. 21;

FIG. 24 is a block diagram showing a semiconductor memory according to still another embodiment of the present invention;

FIG. 25 is a circuit diagram showing a detailed arrangement of a data latch circuit in the semiconductor memory of the invention in FIG. 24;

FIG. 26 is a timing chart for explaining the semiconductor memory of the present invention in FIG. 24;

FIG. 27 block diagram showing a semiconductor memory according to still another embodiment of the present invention;

FIG. 31 is a timing chart for explaining an operation of the semiconductor memory of the present invention in FIG. 27;

FIG. 32 is a block diagram showing a semiconductor memory according to still another embodiment of the present invention;

FIG. 33 is a circuit diagram showing a detailed arrangement of a column address buffer or a row address buffer in the semiconductor memory in FIG. 32;

FIG. 34 is a circuit diagram showing a detailed arrangement of an address change detection circuit used with the pulse signal generator shown in FIG. 32;

FIG. 35 is a timing chart for explaining an operating of the address change detection circuit shown in FIG. 34;

FIG. 38 is a circuit diagram showing a pulse width detection circuit having an arrangement different from that of the pulse width detection circuit in FIG. 34;

FIG. 39 is a timing chart for explaining an operation of the pulse width detection circuit in FIG. 36;

FIG. 42 is a circuit diagram showing a detailed arrangement of a transfer control circuit in the semiconductor memory of the present invention in FIG. 32;

FIG. 43 is a circuit diagram showing a transfer control circuit, in the semiconductor memory in FIG. 32, having an arrangement different from that of the transfer control circuit in FIG. 42;

FIG. 44 is a block diagram showing a semiconductor memory according embodiment of the present invention;

FIG. 45 is a circuit diagram showing a detailed arrangement of the transfer control circuit in each of the semiconductor memories of the present invention in FIGS. 4, 13, 18, 24, 27, 32 and 44.

DETAILED DESCRIPTION OF THE PREFERRED EMBODIMENTS

Figure 1:
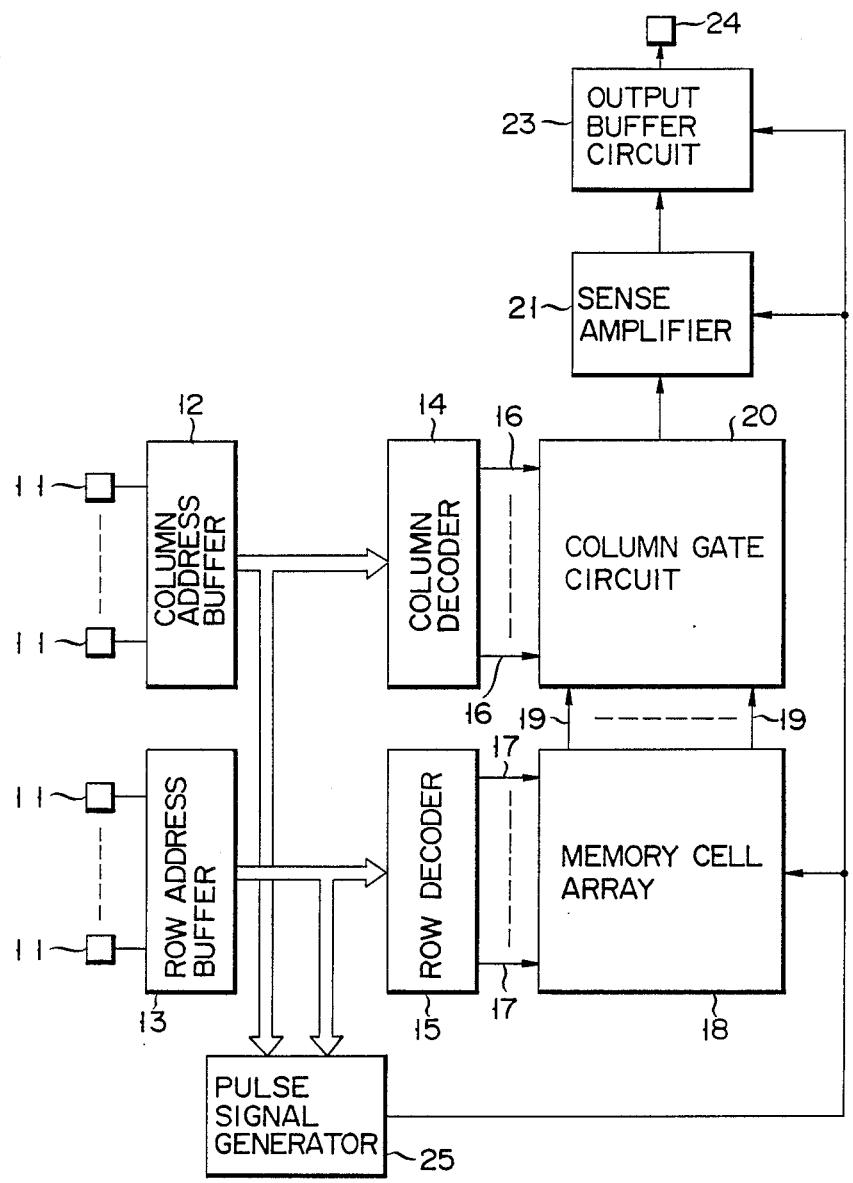
FIG. 1 is a block diagram showing a conventional semiconductor memory.

Preferred embodiments of the present invention will be described below with reference to the accompanying drawings.

FIG. 4 is a block diagram showing an overall arrangement of a semiconductor memory, e.g., a RAM, to which the present invention is applied. Note that a circuit portion associated with data writing is omitted in this case so as to simplify a description.

Referring to FIG. 4, reference numerals 11 denote address input terminals; 12, a column address buffer for generating complementary internal column address signals which have the same level as and a level opposite to those of bit signals of an column address signal constituted by a plurality of bits supplied to address input terminals 11; 13, a row address buffer for generating complementary internal row address signals having the same level as and a level opposite to those of bit signals of a row address signal constituted by a plurality of bits supplied to address input terminals 11; 14, a column decoder to which the internal address signals are supplied; 15, a row decoder to which the internal address signals are supplied; 16, column selection lines selectively driven by an output from column decoder 14; 17, row lines selectively driven by an output from row decoder 15; 18, a memory cell array constituted by a plurality of memory cells arranged in the form of a matrix; 19, bit lines to which the memory cells in memory cell array are respectively connected; 20, column gate circuit for selecting bit line 19 on the basis of a signal from column selection line 16; 21, a sense amplifier for detecting data on the bit line selected by column gate circuit 20; 22, a transfer control circuit for receiving the output data from sense amplifier 21 and performing output control of this detection data; 23, an output buffer circuit; 24, a data output terminal; 25, a pulse signal generator for detecting a logic level change of the address input signal from the address input terminal 11, and outputting a pulse signal. Operations of transfer control circuit 22 are controlled by an output pulse signal from pulse signal generator 25. Transfer control circuit 22 quickly transfers detection data from sense amplifier 21 to output buffer circuit 23 by a pulse signal generated the pulse signal generator 25.

Assume that an operation error occurs in column or row address buffer 12 or 13 by the change of the power source voltage when data is output from output buffer circuit 23 in the above arrangement. More specifically, assume that an internal column or row address signal is temporarily inverted due to a variation in power source voltage or ground voltage applied to column or row address buffer 12 or 13. At this time, pulse signal generator 25 generates a pulse signal in the same manner as in a case wherein an address input is normally changed. Memory cell array 18, sense amplifier 21, and output buffer circuit 23 operate in the same manner as in a case wherein an address input is normally changed. In this case, detected data from the selected memory cell is not transferred from output buffer 23. The reason why detected data is not transferred from output buffer circuit 23 is as follows.

Figure 5:
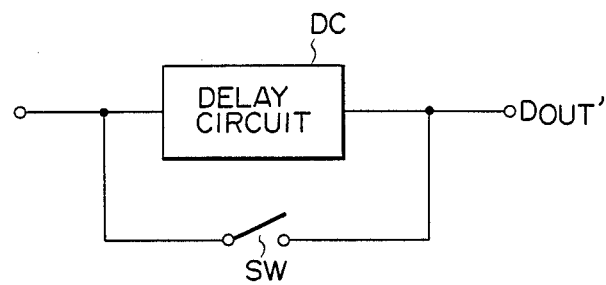
FIG. 5 is a circuit diagram showing a detailed arrangement of a transfer control circuit in the semiconductor memory of the present invention in FIG. 4.
Figure 6:
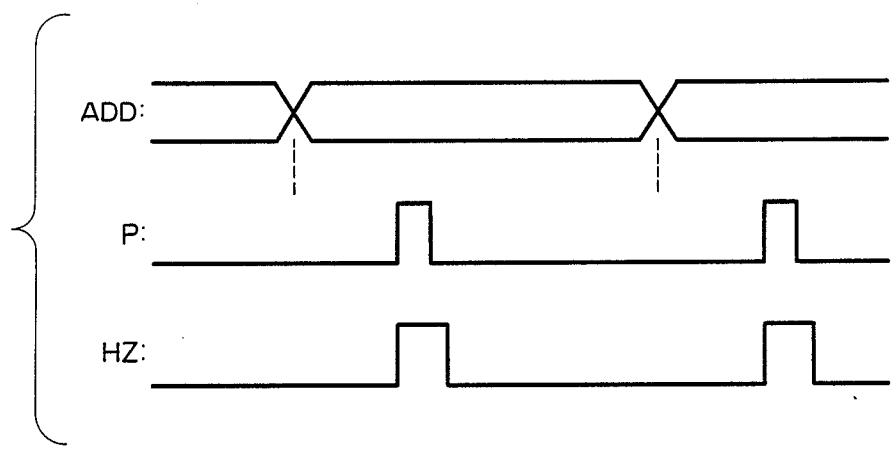
FIG. 6 is a timing chart for explaining an operation of transfer control circuit in FIG. 5.

FIG. 5 shows a circuit arrangement of transfer control circuit 22 in the semiconductor IC shown in FIG. 4. FIG. 6 shows a timing chart of the circuit in FIG. 5. An operation of transfer control circuit 22 will be described below. When an address is changed and a new memory cell is selected, data from the selected memory cell is detected by sense amplifier 21. The detected data is transferred to output buffer 23 and is output therefrom. When this new data is transferred to output buffer 23, switch SW shown in FIG. 5 is closed by pulse signal P generated from pulse signal generator 25 so as to quickly transfer the data to output buffer 23. Pulse signal P is set at "0" level so as to open switch SW before the new data is output from the output stage of the output buffer 23 and the change of the power source voltage occur. After the data is output, the data from sense amplifier 21 is supplied to output buffer 23 through delay circuit DC.

Since delay circuit DC is constituted by a resistor element and a capacitor, a short-time operation error in, e.g., sense amplifier 21 can be absorbed by delay circuit DC. Therefore, no erroneous data is transferred. The delay time of delay circuit DC is set in accordance with a time during which erroneous data appears. Even if a decoder input is erroneously read because of noise, an operation error can be prevented by setting the delay time to be longer than the time during which the erroneous data is output. It is preferable that pulse signal P is a signal which goes to "1" level after a lapse of a predetermined period of time upon a change in address, and that a time during which pulse signal P is kept at "1" level is set to fall within a time interval between the instant when data from a newly selected memory cell in memory cell array 18 is output from sense amplifier 21 and is transferred to output buffer 23 and the instant when the data is externally output from output buffer 23. A delay circuit using a MOS transistor may be employed.

Signal HZ in FIG. 6 is used to control output buffer 23. This signal is not necessarily required. However, if signal HZ is kept at "1" level for a predetermined period of time after an address is changed, and is set at "0" level after signal P goes to "0" level, an operation error does not occur. Because data can be output from output buffer 23 after signal P is set at "0" level.

Figure 7:
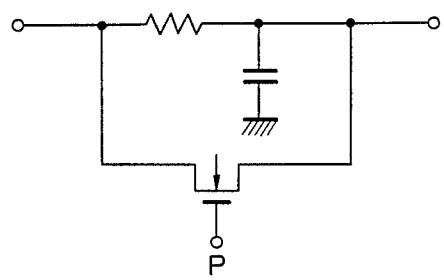
FIG. 7 is a circuit diagram showing a detailed arrangement of a delay circuit in the transfer control circuit in FIG. 5.

FIG. 7 shows a detailed circuit arrangement of delay circuit DC and switch W, the delay circuit DC is constituted by resistor R and capacitor C. The switch SW consists of a MOS transistor controlled by a pulse single P. In addition, a transfer control circuit shown later in FIG. 43 may be used.

Figure 8:
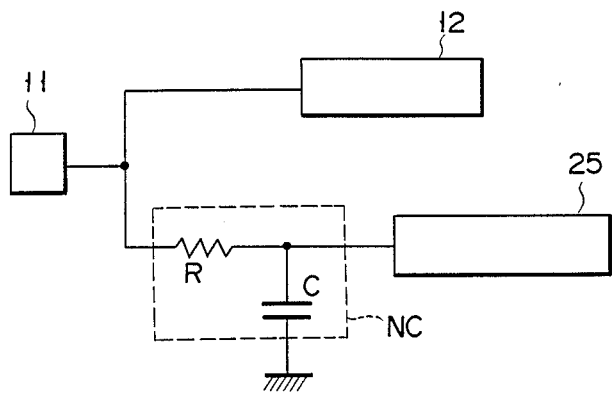
FIG. 8 is a circuit diagram showing an arrangement wherein a noise canceller is arranged at the input side of a pulse signal generator in the semiconductor memory of the present invention in FIG. 4.

FIG. 8 shows a circuit wherein noise canceller NC is arranged in pulse signal generator 25 in FIG. 4. According to this circuit, noise canceller NC consists of resistor R1 and capacitor C1. The pulse signal generator 25 is connected to the input terminal 11 through this noise canceller NC. When noise is superposed on the address, this noise is absorbed by noise canceller NC, thereby preventing pulse signal generator 25 from erroneously outputting output P.

Note that noise canceller NC is not limited to the one described above.

Figure 9:
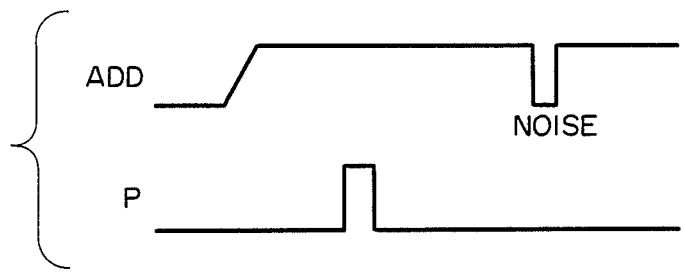
FIG. 9 is a timing chart for explaining an operation of in FIG. 8.
Figure 46:
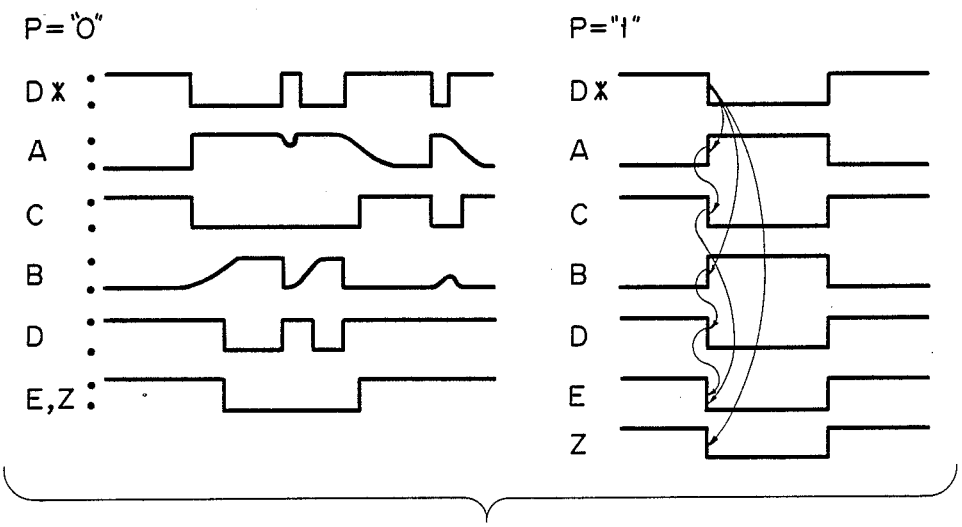
FIG. 46 is a timing chart for explaining an operation of the transfer control circuit in FIG. 45.

As shown in FIG. 9, even if noise is superposed on address input ADD, signal P is not output from pulse signal generator 25.

FIG. 10 is a circuit diagram showing detailed arrangement of pulse signal generator 25 in the circuit according to the above embodiment. As shown in FIG. 10, this circuit comprises m address change detection circuits 111-1 to 111-m for respectively generating pulse signals P1 to Pm by detecting changes of address signals A1 to Am and OR gate circuit 142 for outputting pulse signal P on the basis of outputs P1 to Pm from m address change detection circuits 111-1 to 111-m.

FIG. 11 is a circuit diagram showing a detailed arrangement of an address change detection circuit used in pulse signal generator 25 shown in FIG. 10. FIG. 12 is a timing chart for explaining an operation of the address change detection circuit. The address change detection circuit comprises delay circuit 51 for delaying one-bit address signal Ai by a predetermined period of time, delay circuit 52 for delaying complementary address signal $\overline{Ai}$ by a period of time equal to that of delay circuit 51, CMOS NAND gate circuit 53 for receiving delay output AiD from delay circuit 51 and address signal $\overline{Ai}$, CMOS NAND gate circuit 54 for receiving delay output $\overline{AiD}$ from delay circuit 52 and address signal Ai, and CMOS NAND gate circuit 55 for outputting signal Pi on the basis of outputs from NAND gate circuits 53 and 54.

In the timing chart of FIG. 12, when a pair of address signals Ai and $\overline{Ai}$ are changed upon normal change in address input, a pulse signal having sufficiently large pulse width T1 is generated as output Pi.

It is desirable that a response time of address buffer 12, 13 for amplifying input data and internally transferring it is short. If noise canceller NC is arranged in the input section of address buffer 12, 13 as in pulse signal generator 25 so as to absorb noise, the response time is prolonged. Hence, this arrangement is not preferable.

In the semiconductor IC according to the present invention, an operation error can be prevented without specifically arranging a noise canceller for absorbing noise in the input portion of address buffer 12, 13. In addition, if noise canceller NC is arranged in pulse signal generator 25, a fast access time is achieved. Even if the noise is erroneously output from address buffer 12, 13 as data because of noise superposed on an address, and erroneous data is output from sense amplifier 21, pulse signal generator 25 does not output signal P because the noise is canceled by the noise canceller NC. The output from sense amplifier 21 is eliminated when it passes through delay circuit DC. Therefore, the erroneous data is not transferred to the output buffer circuit. Furthermore, when a normal address is changed, pulse signal generator 25 delays output of signal P by the operation time of noise canceller NC. A time interval between the instant when the address is transferred to internal circuits such as decoder 14, 15 and memory cell array 18 and the instant when data is output from sense amplifier 21 is longer than the delay time of noise canceller NC. Signal P may close switch SW when the data is output from sense amplifier 21. Therefore, the operation time of noise canceller NC, the time for signal P to be output from pulse signal generator 25, and the time interval between the instant when an address input is input and the instant when data is output from sense amplifier can be set to be substantially equal to each other. With this arrangement, the response time of pulse signal generator 25 need not be short. For this reason, even if noise canceller NC is arranged in the input portion of pulse signal generator 25, the data access time of the overall system is fast.

Figure 13:
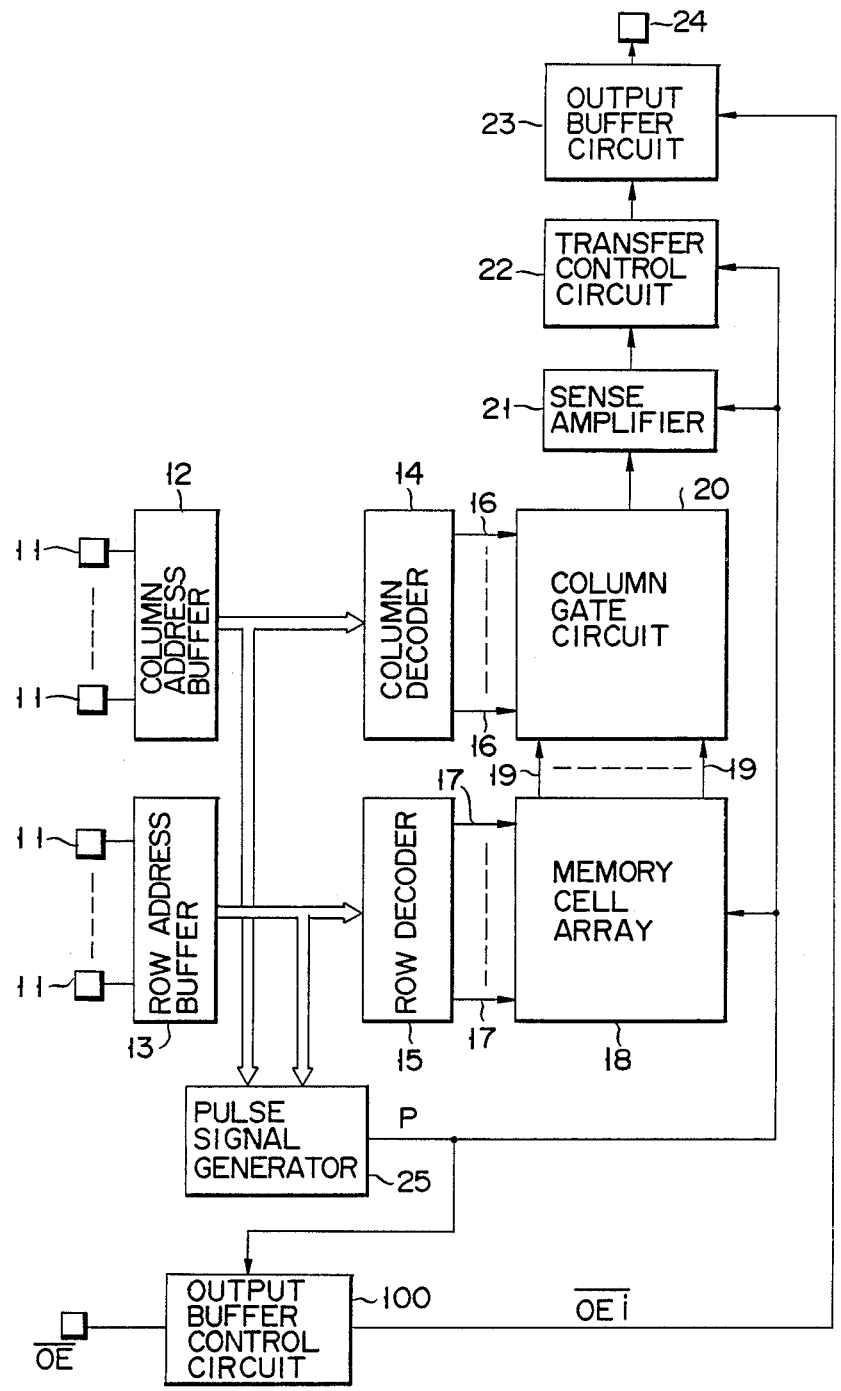
FIG. 13 is a block diagram showing a semiconductor memory according to another embodiment of the present invention.

FIG. 13 shows part of a semiconductor memory, e.g., an EPROM. This memory is different from the semiconductor memory shown in FIG. 4 in that it comprises output buffer control circuit 100 for controlling output buffer circuit 23, sense amplifier and memory cell array 18 are controlled by pulse signals from generator 25 connected the output of the address buffer.

Though it is explained in FIG. 13 that memory cell array 18, sense amplifier 21 and transfer control circuit 22 are controlled by an output signal supplied from pulse signal generating circuit 25 for the sake of simplicity, these circuits, 18, 21 and 22 may be controlled by pulse signals having optimum timings, respectively in all the embodiments in the specification.

An operation of the memory in FIG. 13 will be described below with reference to the timing chart of FIG. 14. When an address input signal is changed at time tl so as to read data from a new memory cell, the memory cell corresponding to the address input is selected from memory cell array 18 by row and column decoders 14 and 15 and column selection gate 20. As a result, data from the selected memory cell is read by sense amplifier 21.

In addition to such a normal read operation, the address input signal change is detected by pulse signal generator 25, and pulse signal P (logic "1" level) is generated. While signal P is generated, the delay time of transfer control circuit 22 is set to be short so that data input to transfer control circuit 22 is instantaneously output and is supplied to output buffer circuit 23. In addition, while signal P is generated, output buffer control circuit 100 controls output buffer circuit 23 to be set in a high-impedance state.

In this case, the time during which output buffer circuit 23 is set in a high-impedance state is set to be substantially equal to the time interval between the instant at which a memory cell is selected by row and column decoders 14 and 15 and column selection gate 20 and the instant at which data from the selected memory cell is read by sense amplifier 21 and reaches output buffer circuit 23 through transfer control circuit 22. With this arrangement, signal P is set at "0" level when the data from the newly selected memory cell reaches output buffer circuit 23. As a result, the high-impedance state of output buffer circuit 23 is canceled, and the data supplied from the selected memory cell is output outside the chip. In addition, when signal P is set at "0" level, a predetermined delay time is set in transfer control circuit 22.

Accordingly, if the time width of a signal input keeping state of the same level to transfer control circuit 22 is shorter than a delay time of circuit 22 when signal P is at "0", this input is absorbed by transfer control circuit 22, and its output is not changed.

Effects of the above-described memory in FIG. 13 will be described below. In a semiconductor memory, the current driving ability of an output-stage transistor of output buffer circuit 23 is normally set to be very large because a load capacitor having a large capacitance of, e.g., about 100 pF, which is arranged outside the memory, must be quickly driven by an output from output buffer circuit 23. For this reason, power source voltage $V_{DD}$ or ground potential $V_{SS}$ varies because of a large current flowing through the output buffer transistor during a data output period. If the driving capacity of the output buffer transistor is increased to output data at a higher speed, the power source variation is increased. Therefore, an operation error occurs in an internal circuit of the conventional IC.

According to the memory in FIG. 13, however, even if an operation error occurs in sense amplifier 21 due to a power source variation upon data output operation, and an erroneous sense amplifier output appears as indicated by portion A in FIG. 14, since signal P is "0" level at this time, and a large delay time is set in transfer control circuit 22, the erroneous output is absorbed by transfer control circuit 22 as long as the time width of the erroneous output from sense amplifier 21 falls within the predetermined period of time, so output buffer circuit 23 does not output erroneous data. Therefore, the driving capacity of the output buffer transistor can be set large, and a data read out speed can the faster.

The output stage of output buffer circuit 23 is set in the high-impedance state during the period when signal P is kept at "1" level due to the following reasons. Address input signals inputted to row and column address buffers are not necessarily changed at the same time. They are changed at slightly different timings. For this reason, combination of erroneous addresses is input during a time interval between the initial and final changes of signals, and data is read from an erroneous memory cell during this time interval. As a result, data from a memory cell corresponding to a final correct address after the final address change is output after the data is output from the erroneous memory cell.

In this case, since signal P is at "1" level and the delay time of transfer control circuit 22 is set short, the data output from the erroneous memory cell is instantaneously input to output buffer circuit 23 through transfer control circuit 22. Therefore, the output of output buffer circuit 23 is set in a high-impedance state during this time interval while erroneous data is inputted to output buffer circuit 23. Signal P is set at "0" level when the data output from the memory cell corresponding to the final correct address after the final address change is input to output buffer circuit 23 through transfer control circuit 22. The high-impedance state of output buffer circuit 23 is released. It is desirable that signal P is set at "1" level when the data from the memory cell selected by the final address reaches transfer control circuit 22.

Accordingly, signal P need not be set at "1" level immediately after an output from row or column address buffer circuit 12 or 13 is changed. It is preferable that signal P is set at "1" level when a predetermined period of time has elapsed from the moment of the change.

As described above, if a variation of $V_{DD}$ or $V_{SS}$ occurs, address buffer circuits (row and column address buffer circuits 12 and 13) may regard this variation as an input change, and an operation error that a pulse corresponding to the power source variation is output to the output of an address buffer circuit may occur. As a result, data from an erroneous memory cell corresponding to an erroneous address including the pulse corresponding to this power source variation may be read by sense amplifier 21. However, the voltage source variation occurs upon data output, and signal P is at "0" level at the start time of this data output.

If the circuit is, therefore, designed such that when address detection circuit 11 detects the pulse corresponding to the power source variation, which is output from the address buffer circuit, and outputs signal P, signal P is set at "1" level when a predetermined period of time has elapsed from the moment at which the address signal is changed. Even if an output is erroneously output from sense amplifier 21 when the address is changed in a pulse-like manner due to the power source variation, since signal P is at "0" level at this time, and a large delay time is set in data transfer control circuit 22, transfer control circuit 22 holds previously output correct data for this delay time, and output buffer circuit 23 completely outputs the previously output correct data. Even if signal P is set at "1" level and output buffer circuit 23 is set in a high-impedance state at this time, output buffer circuit 23 has already output correct data, and this correct data is maintained by a parasitic capacitance of the output section of output buffer circuit 23.

That is, the time interval between the instant when the data output is started by output buffer circuit 23 and the instant when the data is completely output as set to be substantially equal to the time interval between the instant when an address signal is changed and the instant when signal P is set at "1" level. In addition, the time during which an address buffer circuit is outputting an erroneous data due to a power source variation falls within the time interval in which the output data of the output buffer circuit 23 is changing. If the time during which signal P is kept at "1" level is set to be slightly longer than the time interval in which an erroneous output from sense amplifier due to an address buffer output change upon power source variation is output from output buffer circuit 23 through transfer control circuit 22. When correct data appears at the output of output buffer circuit 23 after a lapse of the predetermined period of time from the instant when the address change due to the above power source variation is completed, signal P is at "0" level and the high-impedance state of the output of output buffer circuit 23 is released, thereby outputting the correct data and preventing an operation error.

Since input data to the IC is supplied from the other IC, even if a noise apparatus in the input signal from the other IC, this noise is regarded as a change in input data in the IC. Therefore, an operation error may occur. However, when the noise appears in the address input data as indicated by portion C in FIG. 14, pulse signal generator detects this noise, and signal P is set at "1" level. As a result, even if the output of output buffer circuit 23 is set in a high-impedance state, output buffer circuit 23 has already output correct data. Since this data is maintained by the parasitic capacitance of the output section of output buffer circuit 23, an erroneous data is not output, and an operation error does not occur in the IC chip.

As described above, according to the arrangement in FIG. 13, an operation error in an internal circuit in the IC due to a power source variation when output data is changed or external noise is input can be prevented. The driving ability of the output buffer transistor can be set large, and the operation margin of an IC chip with respect to the power source variation and the noise input can be set large while a fast read out speed of data is maintained. In addition, a highly reliable semiconductor IC is obtained.

Figure 15:
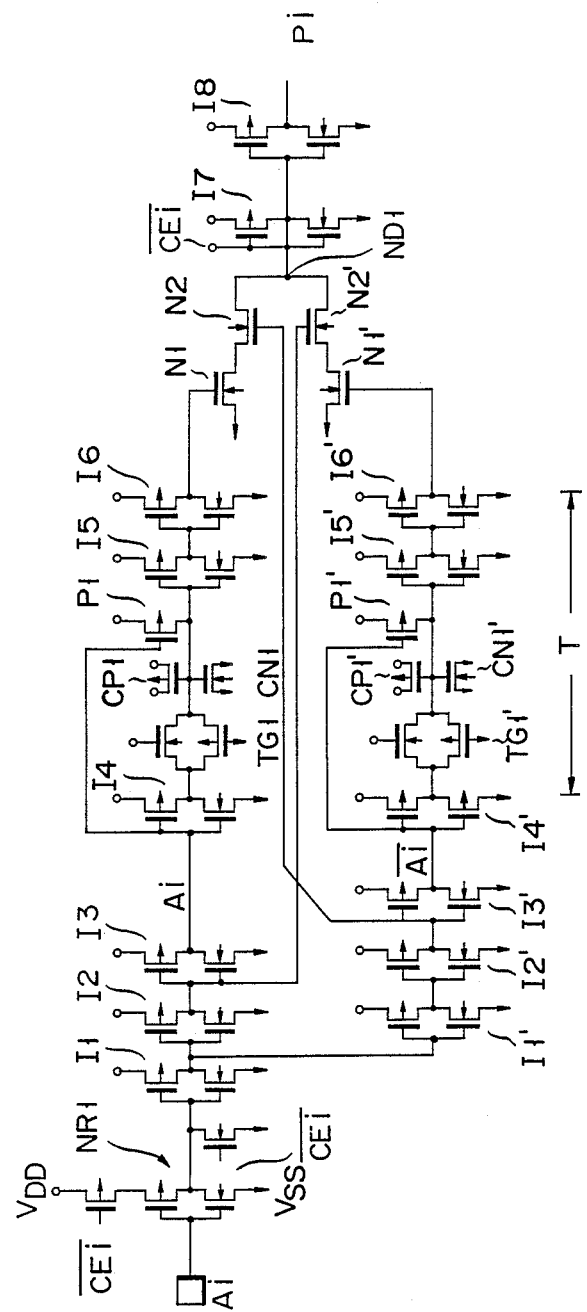
FIG. 15 is a circuit diagram showing a detailed one-bit arrangement of column and row address buffers and a pulse signal generator in the semiconductor memory in FIG. 13.
Figure 16:
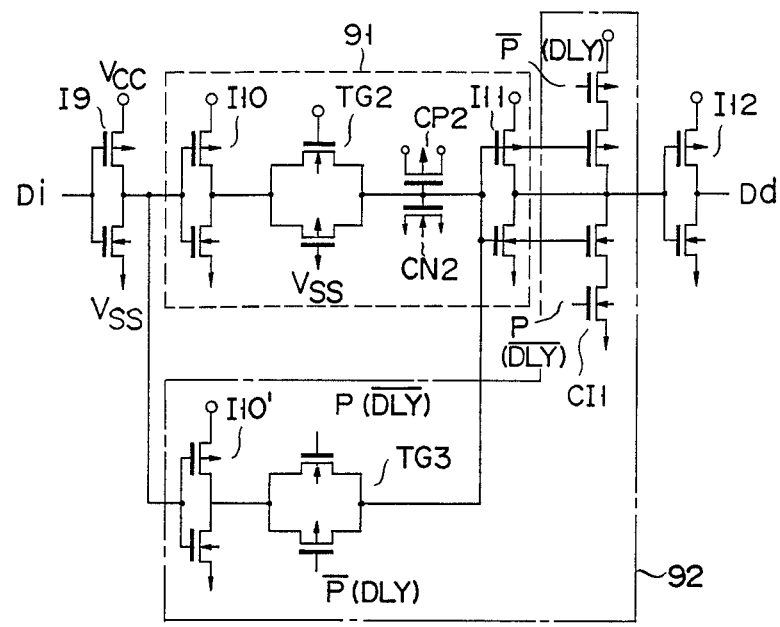
FIG. 16 is a circuit diagram showing a detailed arrangement of a transfer control circuit in the semiconductor memory in FIG. 13.
Figure 17:
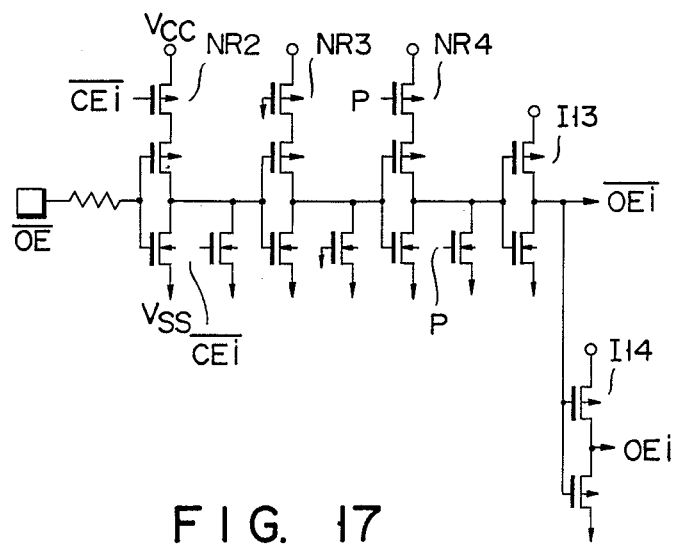
FIG. 17 is a circuit diagram showing a detailed arrangement of an output buffer control circuit in the semiconductor memory in FIG. 13.

FIG. 15 shows a detailed arrangement of a one-bit part of the address buffer circuit (row and column address buffer circuits 12 and 13) and pulse signal generator 25. FIG. 16 shows a detailed arrangement of transfer control circuit 22. FIG. 17 shows a detailed arrangement of output buffer control circuit 100. These arrangements will be briefly described below.

In the address buffer circuit and the pulse signal generator shown in FIG. 15, reference symbol Ai denotes an address input; $\overline{CEi}$, an internal chip enable signal which is generated by a chip enable buffer circuit (not shown) in response to an external chip enable signal input $\overline{CE}$ (or chip selection signal) and is used to set an IC chip in an active state or a standby state; $V_{DD}$, a power source potential; and $V_{SS}$, a ground potential. The address input Ai and signal $\overline{CEi}$ are two inputs of NOR gate NR1 in the address buffer circuit. Inverter I1 is connected to an output of the NOR gate NR1. Inverter I2 is connected to the output of inverter I1. Inverter I3 is connected to the output of inverter I2. In addition, inverter I1' is connected to an output of inverter I1. Inverter I2' is connected to the output of inverter I2'. Inverter I3' is connected to the output of inverter I2'. Outputs Ai and $\overline{Ai}$ from inverters I3 and I3' ar respectively output to address change detection circuit 11.

In pulse signal generator 25, output Ai from inverter I3 is input to inverter I4, and inverter I5 is connected to the output of inverter I4 through transfer gate TGI constituted by parallel-connected n- and p-channel transistors respectively having gates connected to potentials $V_{DD}$ and $V_{SS}$. Capacitor CP1 constituted by a p-channel transistor having a source-drain path connected to potential $V_{DD}$ and capacitor CN1 constituted by n-channel transistor having a drain-source path connected to potential $V_{SS}$ are connected to an output node of transfer gate TG1. In addition, p-channel transistor P1 is connected between the output node and potential $V_{DD}$. Output Ai from inverter I3 is connected to the gate of transistor P1.

The output of inverter I6 connected inverter I5 is connected to the gate of n-channel transistor N1 having a source connected to potential $V_{SS}$. The source of n-channel transistor N2 is connected to the drain of n-channel transistor N1.

Output $\overline{Ai}$ from inverter I3' is connected to inverter I4'. Inverter I5' is connected to the output of inverter I4' through transfer gate TGI' constituted by parallel-connected n- and p-channel transistors having gates respectively connected to potentials $V_{DD}$ and $V_{SS}$. Capacitor CP1' constituted by a p-channel transistor having a source-drain path connected to potential $V_{DD}$ and capacitor CN1' constituted by an n-channel transistor having a drain-source path connected to potential $V_{SS}$ are connected to an output node of transfer gate TG1'. In addition, p-channel transistor P1' is connected between the output node and potential $V_{DD}$. Output $\overline{Ai}$ from inverter I3' is connected to the gate of transistor P1'.

The output from inverter I6' connected to inverter IC' is connected to the gate of n-channel transistor N1' having a source connected to potential $V_{SS}$. The source of n-channel transistor N2' is connected to the drain of n-channel transistor N1' Outputs from inverters I2 and I2' are respectively input to the gates of n-channel transistors N2 and N2' The drains of transistors N2' and N2 are connected to each other. The input of inverter I8 and the output of inverter I7 for receiving signal $\overline{CEi}$ are connected to the connecting point (node ND1) of transistors N2 and N2'.

A circuit consisting of inverter I4 to n-channel transistor N1, and a circuit consisting of inverter I4' to n-channel transistor N1' respectively constitute delay circuits each having delay time T.

In the address buffer circuit and the pulse signal generator shown in FIG. 15, when signal $\overline{CEi}$ is set at "0" level, and the chip is set in a selection state (active state), output node ND1 of inverter I7 is set at "1" level. In this case, when address input Ai is changed, a corresponding one of n-channel transistors N2' and N2 is turned on, and node ND1 is set at "0" level. Subsequently, a corresponding one of n-channel transistors N1' and N1 is turned off when delay time T of the delay circuit has elapsed, so that node ND1 is set at "1" level again. As a result, signal Pi having pulse width T is output from inverter I8. Signals Pi from the pulse signal generator shown in FIG. 15 arranged to correspond to each bit of an address input are ORed by an OR gate to form signal P similarly in FIG. 10.

In a transfer control circuit shown in FIG. 16, data input Di from sense amplifier 21 is input to delay circuit 91 and bypass circuit 92 through inverter I9. In delay circuit 91, an output from inverter I9 is input to inverter I10, and inverter I11 is connected to the output of inverter I10 through transfer gate TG2 constituted by parallel-connected n- and p-channel transistors having gates respectively connected to potentials $V_{DD}$ and $V_{SS}$. In addition, capacitor CP2 constituted by a p-channel transistor having a source-drain path connected to potential $V_{DD}$ and capacitor CN2 constituted by an n-channel transistor having a drain-source path connected to potential $V_{SS}$ are connected to an output node of transfer gate TG2.

Bypass circuit 92 is parallel-connected to delay circuit 91. An output of inverter I9 is input to inverter I10'. One terminal of transfer gate TG3 constituted by parallel-connected p- and n-channel transistors respectively having gates for receiving Inverted signal $\overline{P}$ of signal P and signal P is connected to the output of inverter I10'. Clocked inverter CI1 is connected to the other terminal of transfer gate TG3. The clocked inverter CI1 includes a P-channel transistor and an n-channel transistor. The p-channel transistor which is turned on when signal $\overline{P}$ is set at "0" level and the n-channel transistor which is turned on when signal P is set at "1" level are connected in series with an inverter circuit. In addition, the other terminal of transfer gate TG3 is also connected to the input terminal of inverter I11 of delay circuit 91. The output terminals of clocked inverter CI1 and inverter I11 are commonly connected, and inverter I12 is connected to this common node.

Delay circuit 91 outputs an input from inverter I9 with a predetermined delay time (e.g., several tens of nanoseconds) through inverters I11 and I12. Even if noise is carried by an input from inverter I9, when the duration of the noise is shorter than the predetermined delay time, the noise is absorbed by delay circuit 91. Hence, delay circuit 91 functions as a kind of noise canceller.

In addition, the driving abilities of inverter I10' and transfer gate TG3 in circuit 92 are set to be much larger than those of inverter I10 and transfer gate TG2 in delay circuit 91 so that when an address input signal is changed and signal P is set at "1" level, transfer gate TG3 is turned on while clocked inverter CI1 is activated, and an input from inverter I9 is instantaneously output through inverter I12. Therefore, circuit 92 functions as a bypass circuit for delay circuit 91.

In an output buffer control circuit shown in FIG. 17, reference numeral $\overline{OE}$ denotes an output enable control signal. Signals $\overline{OE}$ and $\overline{CEi}$ are input to two-input NOR gate NR2. The output of NOR gate NR2 is connected to one input of two-input NOR gate NR4 through two-input NOR gate NR3 having one input connected to potential $V_{SS}$. Signal P is input to the other input of NOR gate NR4. Inverter is connected to the output of NOR gate NR4. Inverter I14 is connected the output of inverter I13.

In the output buffer control circuit described above, when both signals $\overline{CEi}$ and P are set at "0" level, signal $\overline{OE}$ becomes signal $\overline{OEi}$ through NOR gates NR2 to NR4 and inverter I13. Signal $\overline{OEi}$ becomes signal OEi through inverter I14. Complementary signals $\overline{OEi}$ and OEi are supplied to output buffer circuit 23 as control signals. When signal P is set at "1" level, an output from NOR gate NR4 is set at "0" level, output signal $\overline{OEi}$ from inverter I13 is set at "1" level, and output signal OEi from inverter I14 is set at "0" level.

Still another embodiment wherein the operation margin of an IC chip with respect to a power source variation during an output data change or an external noise input is further increased will be described below in comparison with the arrangement shown in FIG. 13.

Figure 19:
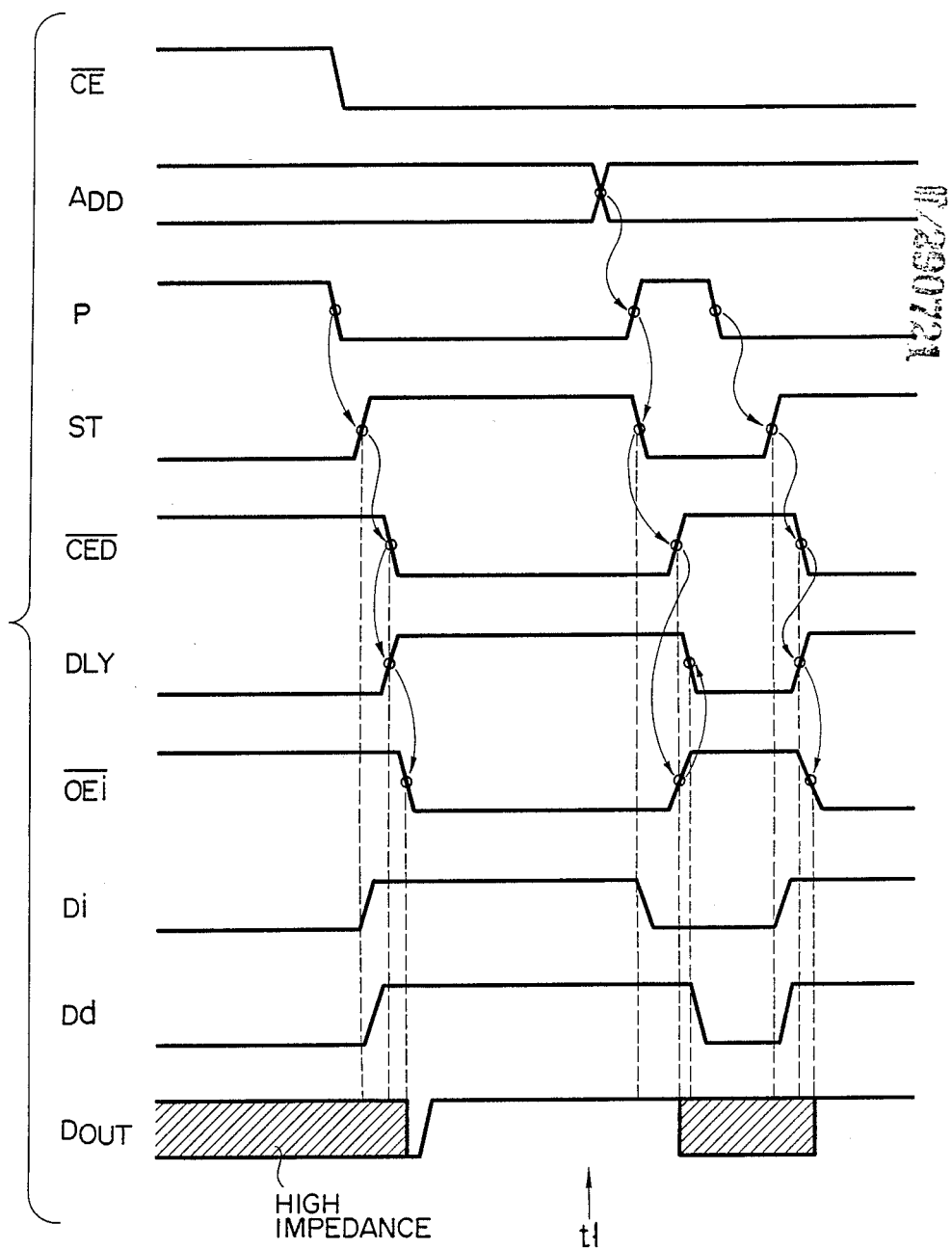
FIG. 19 is a timing chart for explaining an operation of the semiconductor memory of the present invention in FIG. 18.

FIG. 18 shows part of a semiconductor memory, which is different from the semiconductor memory shown in FIG. 13 in that it comprises control circuit 112 for receiving signals P from pulse generator 25. Control circuit 112 outputs sense amplifier control signal ST, transfer control circuit control signal DLY, and output buffer control circuit control signal $\overline{CED}$. Since other arrangements are the same as those of the circuit shown in FIG. 13, the same reference numerals in FIG. 18 denote the same parts as in FIG. 13. In this case, inverted signal $\overline{DLY}$ of signal DLY and signal DLY are respectively supplied to transfer control circuit 22 in place of signals $\overline{P}$ and P, as shown in FIG. 19.

An operation of the memory in FIG. 18 will be described below with reference to the timing chart of FIG. 19. When address input signal Add is changed at time t1 so as to read data from a new memory cell, a memory cell corresponding to the address input is selected. Data from the selected memory cell is read by sense amplifier 21. A change in address input signal Add is detected by pulse signal generator 25, and hence signal P at "1" level is outputted for a predetermined period of time. The above-described operation of the memory in FIG. 18 is the same as that of the memory in FIG. 13. Signal P is input to control circuit 112. As a result, control circuit 112 generates sense amplifier control signals (signal ST and its inverted signal $\overline{ST}$), transfer control circuit control signals (signal DLY and its inverted signal $\overline{DLY}$), and output buffer control circuit control signal $\overline{CED}$.

The sense amplifier control signals (signal ST and its inverted signal $\overline{ST}$) are used to read data at a higher speed and to control sense amplifier 21 and at the same time control the potential of a column line through which data is read from a memory cell. Signal ST and its inverted signal $\overline{ST}$ are used to control the potential of a column line through which data is read from a memory cell to be set at an intermediate level between the potentials of the column line respectively corresponding to "1" level and "0" level of data of the memory cell.

More specifically, the potential of the column line is set at the intermediate level by signal ST and its Inverted signal $\overline{ST}$ by utilizing the time interval between the instant when the address input signal is changed and the new memory cell is selected and the instant when the cell data is transferred to the column line. As a result, when the data from the memory cell is read, the potential of the column line is changed from the intermediate level to the "1" or "0" potential. Therefore, the time required for a change in data on a column line is decreased to half in comparison with the conventional memory wherein when data from a memory cell is read, the potential of a column line is changed from the "1" potential to the "0" potential, and vice versa. Even if sense amplifier 21 detects the intermediate level while the potential of the column line is kept at the intermediate level, since this detection data is not the correct one, signal ST is set at "0" level at this time so as to control sense amplifier 21 in an inoperative state, thereby preventing excess current consumption through sense amplifier 21.

In some semiconductor memories, a potential of a column line and a potential of a dummy column line are compared with each other by using a differential amplifier so as to detect data stored in a memory cell. A memory of this type is controlled in the following manner.

When an address input signal is changed and signal P is set at "1" level, signal ST is set at "0" level. As a result, sense amplifier 21 is controlled to be in an inoperative state so as to decrease its current consumption, and at the same time, equalizing transistors (transistors N5, P3, and N6 in a circuit comprising a memory cell array, a column selection gate, and a sense amplifier shown in FIG. 21 to be described later) connected between the column line and the dummy column line are turned on so as to substantially equalize the potentials of the lines. Thereafter, when data from a newly selected memory cell appears on the column line, signal ST is set at "1" level. Since the signal ST is set at 1 level, the equalizing transistors are turned OFF. In this case, the potentials of the column line and the dummy column line are set to be substantially equal to each other. When data from the memory cell and the dummy cell appear on the column line and the dummy column line, a potential difference immediately occurs between the potentials of the lines. Since this potential difference is sensed and amplified by the differential amplifier, a fast read out speed of data can be achieved. As described above, when signal ST as set at "1" level, sense amplifier 21 senses the data from the newly selected memory cell the sensed data send to transfer control circuit 22.

When signal ST is set at "0" level, output buffer control circuit control signal $\overline{CED}$ is set at "1" level. As a result, output $\overline{OEi}$ from output buffer control circuit 100 is set at "1" level, and the output of output buffer circuit 23 is set in an high-impedance state. In addition, when signal ST is set at "0" level, transfer control circuit control signal DLY is set at "0" level. As a result, the delay time of transfer control circuit 22 is set to be short so that an input to transfer control circuit 22 is instantaneously supplied to output buffer circuit 23. In this case, the output of output buffer circuit 23 is set in the high-impedance state due to the following reasons. As described above, since address input signals are changed at slightly different timings, data is output from a memory cell corresponding to an erroneous address during the time interval between initial and final moments of change of address signals. If signal DLY is set at "0" level at this time, the data from the erroneous memory cell is instantaneously input to output buffer circuit 23 through transfer control circuit 22.

In this case, therefore, if the output of output buffer circuit 23 is set in the high-impedance state, data output from the erroneous memory cell can be prevented. In addition, as described above, since an output from sense amplifier 21 need not be output from output buffer circuit 23 while sense amplifier 21 is controlled to be in an inoperative state, the output of output buffer circuit 23 is set in the high-impedance state.

Furthermore, when the data from the newly selected memory cell is sensed/amplified by sense amplifier 21 and reaches transfer control circuit 22, signal DLY is set at "0" level so as to shorten the delay time of transfer control circuit 22 and quickly transfer the data. When the delay time of transfer control circuit 22 is set long and transfer control circuit 22 functions as a noise canceller, an output from transfer control circuit 22 is preferably kept output from output buffer circuit 23. Therefore, signal $\overline{CED}$ or DLY need not be switched immediately after signal ST is set at "0" level. I is instead preferable that signal $\overline{CED}$ or DLY is switched when a predetermined period of time has elapsed from the instant when signal ST is set at "0" level.

Signal ST is set at "1" level when the potentials of the column line and the dummy column line become substantially equal to each other. As a result, the data from the newly selected memory cell is sensed/amplified by sense amplifier 21 and is input to transfer control circuit 22. In this case, since signal DLY is at "0" level and hence the delay time of transfer control circuit 22 is short, the input to circuit 22 is instantaneously output and supplied to output buffer circuit 23. Control signal $\overline{CED}$ is set at "0" level when the data from the newly selected memory cell reaches output buffer circuit 23. Consequently, output $\overline{OEi}$ from output buffer control circuit 100 is set at "0" level, and the high-impedance state of the output of output buffer circuit 23 is released, thereby externally outputting the data from the newly selected memory cell. When control signal $\overline{CED}$ is set at "0" level, signal DLY is set at "1" level, and hence the delay time of transfer control circuit 22 is set to be long.

That is, the delay time of transfer control circuit 22 is set to be short when signal DLY is set at "0" level so that its input is instantaneously output, whereas the delay time is prolonged to a predetermined value when signal DLY is set at "1" level. Therefore, when signal DLY is set at "1" level, if the time width of an input signal to transfer control circuit 22 is shorter than the predetermined value of the delay time thereof, this input is absorbed by transfer control circuit 22, so that its output is not changed. In this arrangement, signal DLY is preferably set at "0" level during the time interval between the instant when data from a newly selected memory cell appears at the output of sense amplifier 21 and the instant when the data is instantaneously output from transfer control circuit 22.

According to the above-described memory shown in FIG. 18, since sense amplifier 21, transfer control circuit 22, and output buffer control circuit 100 are controlled by different signals, the circuit operation margin can be further increased. In addition, according to the above memory, even if an operation error occurs in sense amplifier 21 due to a power source variation upon data output operation, since signal DLY is at "1" level at this time and a large delay time is set in transfer control circuit 22, an erroneous output from sense amplifier 21 is absorbed by transfer control circuit 22 as long as the time width of the erroneous output falls within the predetermined delay time, and hence the output of transfer control circuit 22 is not changed, thereby preventing output buffer circuit 23 from outputting the erroneous data. In addition, even if noise is carried by an address input portion or an input signal, output of erroneous data from output buffer circuit 23 can be prevented, as described above.

That is, according to the above-described arrangement shown in FIG. 18, a highly reliable semiconductor IC can be obtained. This semiconductor IC can prevent an operation error in its internal circuits caused by a power source variation upon a change in output data, or an external noise input. In addition, in the semiconductor IC, the driving ability of an output buffer transistor can be set to be large, and the operation margin of each IC chip with respect to the power source variation or the noise can be increased while its data read out speed is kept high.

FIG. 20 shows a detailed arrangement of control circuit 112 in the semiconductor memory shown in FIG. 18. FIG. 21 shows a detailed arrangement of memory cell array 18, column selection gate 20, and sense amplifier 21. FIG. 22 shows a detailed arrangement of output buffer control circuit 100. These arrangements will be briefly described below. In the semiconductor memory shown in FIG. 18, when data is to be read from a memory cell, the following two cases are considered. In the first case, data is read from a memory cell newly selected by a change in address input when the chip is in a selection state (active state). In the second case, data is read from a memory cell selected by an address which is input when the chip is switched from a non-selection state (standby state) to a selection state (active state). That is, data is read when an address input is changed or when a chip enable input (or chip selection signal) is changed.

In control circuit 112 shown in FIG. 20, therefore, address buffer equivalent circuit 121, row decoder equivalent circuit 122, word line equivalent circuit 123, and timing detection circuit 124 are connected to the input of ST signal generator 125 so as to cause ST signal generator 125 to output signal $\overline{ST}$ and its inverted signal ST at timings corresponding to a time interval between the instant when either of the above two cases occurs, i.e., an address input is changed or a chip is set in a selection state, and the instant when a word line in the memory cell array is actually selected.

More specifically, signal $\overline{CEi}$ is supplied to row decoder equivalent circuit 122 through address buffer equivalent circuit 121. The output stage of row decoder equivalent circuit 122 is controlled by signal P so that an output from circuit 122 is input to word line equivalent circuit 123. Memory cells CELL of word line equivalent circuit 22 are connected to signal line DWL corresponding to a word line. N-channel transistors NI03, each of which is turned on by signal P, are connected between signal line DWL and the ground terminal. Timing detection circuit 124 is connected to the output side of word line equivalent circuit 123.

With this arrangement, when an address input is changed and signal P is set at "1" level while signal $\overline{CEi}$ is set at "0" level, i.e., in an active state, an output from word line equivalent circuit 123 is set at "0" level. When signal P is set at "0" level after this operation, signal line DWL corresponding to a word line in word line equivalent circuit 123 is charged to "1" level at the same speed as that at which a word line in memory cell array 18 is charged. Timing detection circuit 124 detects a timing at which the word line in memory cell array 18 reaches a predetermined level.

When signal $\overline{CEi}$ is set at "0" level and activated in a state wherein an address is input, the change of the signal $\overline{CEi}$ is input to word line equivalent circuit 123 through address buffer equivalent circuit 121 and row decoder equivalent circuit 122. Subsequently, signal DWL corresponding to a word line in word line equivalent circuit 123 is charged to "1" level at the same speed as that at which the word line in memory cell array 18 is charged. Timing detection circuit 124 detects a timing when the word line of memory cell array 18 reaches a predetermined level. In timing detection circuit 124, single p-channel transistor P103 and two parallel-connected n-channel transistors N105 and N106 are connected in series between potentials $V_{DD}$ and $V_{SS}$ so that an input can be supplied to each gate. In this embodiment, two n-channel transistors are used. However, if a plurality of p- and n-channel transistors are prepared, and the number of transistors to be connected is changed, a ratio of p-channel transistors to n-channel transistors can be arbitrarily changed. Therefore, the detection level (threshold value) of timing detection circuit 124 for detecting the voltage of signal line DWL corresponding to a word line in word line equivalent circuit 123 can be arbitrarily set.

An output from timing detection circuit 124 as input to ST signal generator 125. Output signal ST from the intermediate stage of ST signal generator 125 is input to $\overline{CED}$ signal generator 126 for generating signal $\overline{CED}$. Output $\overline{CED}$ from $\overline{CED}$ signal generator 126 is input to DLY signal generator 127 together with signal $\overline{OEi}$. As a result, DLY signal generator 127 generates signal DLY and its inverted signal $\overline{DLY}$. In each circuit described above, reference numeral I denotes an inverter; C, a capacitor; P, a p-channel transistor; N, an n-channel transistor; NR, a NOR gate; NA, a NAND gate; and TG, a transfer gate.

In control circuit 112, after signal P becomes at "1" level, signal ST is set at "0" level. Signal $\overline{CED}$ is set at "1" level, after signal ST becomes "0" level. After signal $\overline{CED}$ becomes "1" level, output signal $\overline{OEi}$ from output buffer control circuit 100 (to be described later with reference to FIG. 27) is set at "1" level. Signal DLY is set at "0" level, after signal $\overline{OEi}$ becomes "1" level. When signal P is set at "0" level, signal ST becomes "1" level after a lapse of a certain delay time. Signal $\overline{CED}$ is set at "0" level, after signal ST becomes "1" level. Signal DLY is set at "1" level, after signal $\overline{CED}$ becomes "0" level. When output buffer control circuit 100 detects "1" lever of signal DLY, signal $\overline{OEi}$ is set at "0" level. That is, when signal P becomes a logic "1" signal ST, signal $\overline{CED}$, signal $\overline{OEi}$, and signal DLY are changed in the order named. When signal P becomes a logic "0" signal ST, signal $\overline{CED}$, signal DLY, and signal $\overline{OEi}$ are changed in the order named.

FIG. 21 shows memory cell array 18, column gate circuit 20, and sense amplifier 21 in the semiconductor memory using a differential amplifier as sense amplifier 21. Referring to FIG. 21, reference symbols MC1 to MCn denote memory cells constituted by floating gate type MOS transistors; DCm, a dummy cell constituted by a floating gate type MOS transistor; WLm, a row line; BL1 to BLn, column lines; and DBL, a dummy column line. Reference numeral 15 denotes a row decoder; and 14, a column decoder. Reference symbols BT1 to BTn denote column selection gate transistors; and DBT, a dummy column selection transistor which is equivalent to one of transistors BT1 to BTn and has a gate connected to potential $V_{DD}$. Transistor DBT is inserted in dummy column line DBL. Reference symbol BL denotes a column line to which column selection gate transistors BT1 to BTn are commonly connected; LD1, a first load circuit connected to column line BL; and LD2, a second load circuit connected to dummy column line DBL. Potential Vin of column BL' at the output side of first load circuit LD1 and potential (reference potential) Vref of dummy column line DBL' at the output side of second load circuit LD2 are input to data detection circuit section 28 (e.g., constituted by a CMOS current mirror) of the differential amplifier type sense amplifier.

In addition, n-channel transistor N5 having a gate for receiving signal $\overline{ST}$ is connected between first and second load circuits LD1 and LD2. A CMOS transfer gate constituted by parallel-connected p- and n-channel transistors P3 and N6 respectively having gates for receiving signal ST and inverted signal $\overline{ST}$ is connected between column line BL' and dummy column line DBL' (between the two input terminals of data detection circuit section 28).

In the sense amplifier described above, activation control p-channel transistor P4 having a gate for receiving inverted signal $\overline{ST}$ is connected between potential $V_{DD}$ and data detection circuit section 28. With this arrangement, when transistor P4 is OFF, data detection circuit section 28 is set in an inoperative state so as to reduce its current consumption. N-channel transistor N7 having a gate for receiving inverted signal $\overline{ST}$ is connected between the output terminal of section 28 and the ground terminal. P-channel transistor P5 having a gate for receiving signal ST is arranged in first load circuit LD1. P-channel transistor P6 having a gate for receiving signal ST is arranged in second load circuit LD2.

In the above-described circuit arrangement in FIG. 21, data from a selected memory cell is detected by comparing reference potential Vref of dummy column line DBL' generated on the basis of data in dummy cell DCm with potential Vin of column line BL' generated on the basis of the data read from the selected memory cell. When an address input signal is changed, signal ST is set at "0" level, so that p-channel transistor P4 for activation control is turned off, and transistors N5, N6, P3, P5, and P6 are turned on. As a result, column line BL' and dummy column line DBL' are short-circuited through transistors N5, N6; and P3, and are set to substantially equal potentials. In this case, in order to set column line BL' and dummy column line DBL' to equal potentials at a higher speed, p-channel transistors P5 and P6 of first and second load circuits LD1 and LD2 are turned on so as to set the current supply capacities of load circuits LD1 and LD2 to be larger than those in a normal read operation. Furthermore, in this case, n-channel transistor N7 at the output side of the sense amplifier is turned on, and an output from the sense amplifier is set at "0" level.

An operation of the sense amplifier shown in FIG. 21 will be described below with reference to the timing chart of the embodiment (FIG. 23A) and the timing chart of a case (FIG. 23B) wherein transistors N5, N6, P3, P5, and P6 are not used. When data from a selected memory cell is at "1" level, potential Vin of column line BL is lower than reference potential Vref of dummy column line DBL'. In this case, according to the above embodiment, as shown in FIG. 23A, when signal ST is set "0" level, column line BL' and dummy column line DBL' are set to equal potentials at a higher speed through transistors N5, N6, and P3. When signal ST is set at "1" level and p-channel transistor P4 is turned on, since the potentials of column line BL' and dummy column line DBL' are changed from substantially the same level, a required potential difference quickly appears. As a result, the data of the memory cell can be sensed/amplified and output at a higher speed.

In contrast to this, if transistors N5, N6, P3, P5, and P6 are not used, the time interval between the instant when potential Vin of column line BL' is changed by data from a selected memory cell and the instant when a required potential difference between potential Vin and reference potential Vref appears is prolonged, as shown in FIG. 23B. Therefore, the data from the memory cell cannot be sensed/amplified at high speed.

In the output buffer control circuit shown in FIG. 22, reference symbol $\overline{OE}$ denotes an output enable control signal. Signals $\overline{OE}$ and $\overline{CEi}$ are input to two-input NOR gate NR5. An output from NOR gate NR5 is input to one input terminal of two-input NOR gate NR7 through two-input NOR gate NR6 having one input connected to potential $V_{SS}$. Signal $\overline{CED}$ is input to the other input terminal of NOR gate NR7, and its output is input to one input terminal of two-input NAND gate NA1. Signal DLY is input to the other input terminal of NAND gate NA1, and inverter I15 is connected to the output side thereof.

In the above output buffer control circuit, when signal $\overline{CED}$ is set at "1" level, an output from NOR gate NR7 is set at "0" level. Signal $\overline{OEi}$ as an output from NAND gate NA1 is then set at "1" level, and signal OEi as an output from inverter I15 is set at "0" level. As a result, the output of output buffer circuit 23 is set in a high-impedance state by complementary signals $\overline{OEi}$ and OEi. In contrast to this, when signals $\overline{CEi}$, $\overline{OE}$, and $\overline{CED}$ are set at "0" level, and signal DLY is set at "1" level, signal $\overline{OEi}$ is set at "0" level, and signal $\overline{OEi}$ as set at "1" level. As a result, data is output from output buffer circuit 23.

FIG. 24 shows part of a semiconductor memory as a semiconductor IC according to still another embodiment of the present invention. This semiconductor memory is different from the conventional semiconductor memory shown in FIG. 4 in that it comprises data latch circuit 27 whose operating condition is controlled by a pulse signal output from pulse signal generator 25, and which is connected between transfer control circuit 22 and output buffer circuit 23.

More specifically, in FIG. 24, row decoder circuit 15 selects word line of memory cell array 18 in which memory cells for storing data are arrayed. Column decoder circuit 14 selects a bit line of memory cell array 18 by controlling column selection gate 20. With this operation, one memory cell is selected from memory cell array 18, and sense amplifier 21 performs a sensing/amplifying operation in accordance with data in the selected memory cell. An output from sense amplifier 21 is read outside the chip through transfer control circuit 22, data latch circuit 27, and output buffer circuit 23. Operations of transfer control circuit 22 and data latch circuit 27 are controlled in a manner to be described later.

Outputs from row and column address buffers 12 and 13 are respectively input to pulse signal generator 25. Subsequently, pulse outputs from pulse signal generator 25 are connected by a single bus line through, e.g., an OR gate (not shown), so that a pulse signal P is generated by pulse signal generator 25. Signal P controls operations of transfer control circuit 22 and data latch circuit 27.

Since address buffer circuits 12 and 13 and address pulse signal generator 25 in FIG. 24 are the same as those described with reference to FIG. 15, a description thereof will be omitted. In the following description, an operative state of transfer control circuit 22 is equivalent to a state wherein delay circuit 91 in FIG. 16 functions as a kind of noise canceller, whereas an inoperative state of transfer control circuit 22 is equivalent to a state wherein circuit 91 functions as a bypass circuit with respect to delay circuit 91 and instantaneously outputs an input.

FIG. 25 shows a detailed arrangement of data latch circuit 27 in FIG. 24. An output from transfer control circuit 22 is input to clocked inverter C12. Three inverters I16 to I18 are connected to the output side of clocked inverter C12. Clocked inverter C13 for latching is connected between the output and input nodes of first-stage inverter I16. In input-stage clocked inverter C12, a p-channel transistor which is turned on by "0"-level signal P and an n-channel transistor which is turned on by "1"-level inverted signal $\bar{P}$ of signal P are connected in series with an inverter. In clocked inverter C13 for latching, an n-channel transistor which is turned on by "0"-level inverted signal $\bar{P}$ of signal P and an n-channel transistor which is turned on by "1"-level signal P are connected in series with an inverter.

While signal P is kept at "0" level, therefore, input-stage clocked inverter C12 is activated, and clocked inverter C13 for latching as in an inactive state. As a result, an input is output to output buffer circuit 23 through input-stage clocked inverter CI2 and three inverters I16 to I18. This state will be referred to as an inoperative (non-latch) state of data latch circuit 27 hereinafter. While signal P is kept at "1" level, inverter CI2 is in an inactive state, and inverter CI3 is activated. As a result, an output from first-stage inverter I16 is latched by clocked inverter CI3 and first-stage inverter I16. This latched data is output to output buffer circuit 23 through inverters I17 and I18. This state will be referred to as an operative state of data latch circuit 27.

An operation of the memory in FIG. 24 will be described below with reference to the timing chart of FIG. 26. When address input signal Add is changed at time t1 so as to read data from a new memory cell, a memory cell corresponding to the address input is selected from memory cell array 18 by row and column decoder circuits 14 and 15, and column selection gate 20. Data from the selected memory cell is read by sense amplifier 21. In addition to such a normal read operation, when address input signal Add is changed, pulse signal generator 25 detects this change, and outputs signal P ("1" level) for a predetermined period of time. When signal P is generated, has a long delay time, data latch circuit 27 is set in an operative state.

Accordingly, data latch circuit 27 latches data from a memory cell corresponding to an address prior to the address change and outputs it to output buffer circuit 23. Transfer control circuit 22 instantaneously outputs the data from the newly selected memory cell which is read and confirmed by sense amplifier 21 to data latch circuit 27. When signal P is set at "0" level after a lapse of a predetermined period of time, transfer control circuit 22 functions as a noise canceller. In addition, data latch circuit 27 is set in an inoperative state, and supplies the output confirmed by sense amplifier 21 to output buffer circuit 23.

In the above described memory in FIG. 24, the same effects as those of the memories described with reference to FIGS. 13 and 18 can be obtained. This will be described below. According to the memory in FIG. 24, even if an operation error occurs in sense amplifier 21 due to a power source variation upon data output, and an erroneous output appears as indicated by portion A in FIG. 26, since signal P is at "0" level at this same and transfer control circuit 22 functions as a noise canceller, the erroneous output is absorbed by transfer control circuit 22 and hence its output is not changed as long as a duration of the erroneous output from sense amplifier 21 falls within the predetermined period of time, thereby preventing output buffer circuit 23 from outputting the erroneous data. Consequently, the driving capacity of an output buffer transistor can be set to be large, and the data read rate can be further increased.

If voltage of a power source varies an address input portion outputs pulse data, data from an erroneous memory cell corresponding to an erroneous address including the pulse corresponding to the power source variation is read by sense amplifier 21, so that an erroneous output appears at the output of sense amplifier 21, as indicated by portion B in FIG. 26. In this case, however, if signal P is set at "1" level, data latch circuit 27 is set in an operative state. Therefore, data latch circuit 27 latches data from a memory cell corresponding to an address before the address change and outputs it to output buffer circuit 23. Even if signal P is set at "0" level after a lapse of a predetermined period of time, since the output from sense amplifier 21 coincides with the latched data in data latch circuit 27, the output of output buffer circuit 23 is not changed from "1" level to "0" level, and vice versa.

In addition, since the data input stage of the IC receives data from another IC, if noise is carried by the input signal from another IC, the IC internal circuit regards this noise as a change in input data, and an operation error may occur. However, even if noise is carried by address input data as indicated by portion C in FIG. 26, and pulse signal generator 25 detects this noise so that signal P is set at "1" level, since data latch circuit 27 is set in an operative state during this period, latches previous data, and keeps outputting it through output buffer circuit 23, erroneous data is not output, and hence no operation error occurs in the IC chip.

As described above, according to the arrangement shown in FIG. 24, a highly reliable semiconductor IC can be obtained. According to this IC, when an address input signal is changed, and output buffer circuit 23 is driven to read data, transfer control circuit 22 is set in an inoperative state and data latch circuit 27 is set in an operative state on the basis of a pulse signal output from pulse signal generator 25 so as to latch the input data for a predetermined period of time, thereby preventing an operation error by a power source variation upon a change in output data, or an external noise input. In addition, the driving capacity of an output buffer transistor can be set to be large, and the operation margin of the IC chip with respect to a power variation and noise can be increased while a high data read rate is kept high.

Still another embodiment wherein the operation margin of the IC chip with respect to a power variation upon a change in output data or an external noise input can be further increased as compared with the IC having the arrangement shown in FIG. 24 will be described below.

FIG. 32 shows part of a semiconductor memory according to the invention. This semiconductor memory is different from the semiconductor memory shown FIG. 4 in that it comprises the following circuits: (1) control circuit 112, for receiving out signal P from pulse signal generator 25 generating sense amplifier control signal ST, transfer control circuit control signal DLY, data latch circuit control signal LTH, and output buffer control circuit control signal $\overline{CED}$, and supplying these signals to sense amplifier 21, transfer control circuit 22, data latch circuit 27, and output buffer control circuit 100, respectively, (2) latch mode change circuit 32 for generating control signal DHS for controlling control circuit 112 on the basis of internal enable signal $\overline{CEi}$ output from chip enable buffer circuit 31 for amplifying/shaping externally input chip enable signal $\overline{CE}$, and (3) output buffer control circuit 100 for controlling output buffer circuit 23 on the basis of output buffer control circuit control signal $\overline{CED}$ from control circuit 112 and control signal DHS from latch mode change circuit 32. Since other arrangements are the same as those of the semiconductor memory in FIG. 24, the same reference numerals in FIG. 27 denote the same parts as in FIG. 24.

The semiconductor memory in FIG. 27 employs a system for detecting data by comparing, e.g., the potential of a column line through which data from a memory cell is read with the potential of a dummy column line by using differential amplifier type sense amplifier 21. Since memory cell array 18, column selection gate 20, and sense amplifier 21 are equivalent to those described with reference to FIG. 21, a description thereof will be omitted.

Figure 28:
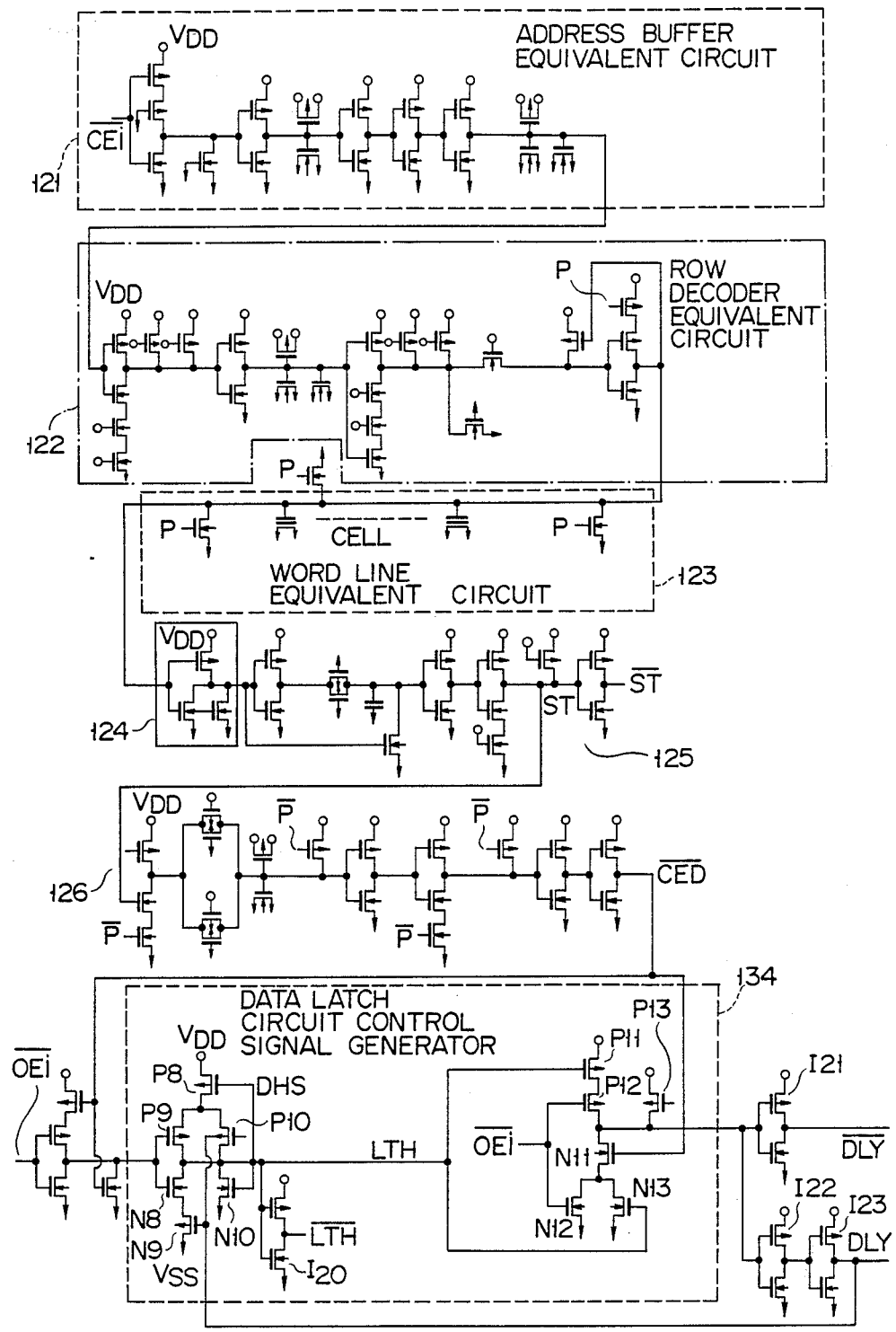
FIG. 28 is a circuit diagram showing a detailed arrangement of a control circuit in the semiconductor memory of the invention in FIG. 27.

Control circuit 112 has an arrangement shown, e.g., in FIG. 28. Control circuit 112 is different from control circuit 112 in FIG. 20 in that data latch circuit control signal generator 134 is added, and signal $\overline{P}$ is input to $\overline{CED}$ signal generator 126. Since other arrangements are the same as those of the circuit in FIG. 20, the same reference numerals in FIG. 28 denote the same parts as in FIG. 20.

More specifically, in data latch control signal generator 134, p-channel transistors P8 and P9 and n-channel transistors N8 and N9 are connected in series between potentials $V_{DD}$ and $V_{SS}$, and an output signal from NOR gate NR to which signals $\overline{CED}$ and $\overline{OEi}$ are input is input to each gate of p- and n-channel transistors P9 and N8. P-channel transistor P10 is connected in parallel to transistor P9. N-channel transistor N10 is connected between the drain of p-channel transistor P10 and potential $V_{SS}$. Signal DHS is input to each gate of n- and p-channel transistors N10 and P8. Signal LTH is obtained at the common node of the drains of p- and n-channel transistors P10 and N10 and p- and n-channel transistors P9 and N8, and signal LTH is inverted by inverter I20 to obtain signal $\overline{LTH}$.

In addition, p-channel transistors P11 and P12 and n-channel transistors N11 and N12 are connected in series between potentials $V_{DD}$ and $V_{SS}$. N-channel transistor N13 is connected in parallel to n-channel transistor N12. P-channel transistor P13 is connected between the node of drains of p- and n-channel transistors P12 and N11 and potential $V_{DD}$. Signal LTH is input to each gate of transistors P11 and N13. Signal $\overline{OEi}$ is input to each gate of transistors P12 and N12. Signal $\overline{CED}$ is input to each gate of transistors P13 and N11.

Inverted signal $\overline{DLY}$ of signal DLY is obtained from the common node of the drains of p- and n-channel transistors P12 and N11 through inverter I21. Signal DLY is obtained from the above node through two inverters I22 and I23. Signal DLY is then input to each gate of p- and n-channel transistors P10 and N9.

With this arrangement, when control signal DHS is set at "1" level, data latch circuit control signal LTH is set at "0" level so as to set data latch circuit 27 in an inoperative state. When signals DHS, ITH, and $\overline{CED}$ are respectively set at "0" level, "1" level, and "1" level, transfer control circuit control signal DLY is set at "0" level so as to set transfer control circuit 22 in an inoperative state.

Figure 29:
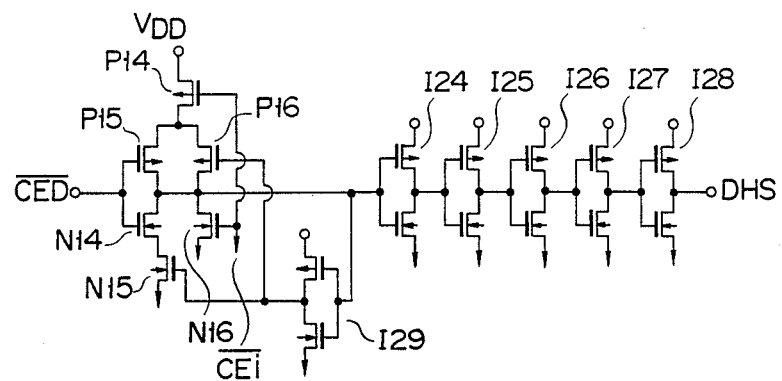
FIG. 29 is a diagram showing a detailed arrangement of a latch mode change circuit in the semiconductor memory of the present invention in FIG. 27.

Latch mode change circuit 32 has an arrangement shown in, e.g., FIG. 29. More specifically, p-channel transistors P14 and P15 and n-channel transistors N14 and N15 are connected in series between potentials $V_{DD}$ and $V_{SS}$. Signal CED is input to each gate of transistors P15 and N14. P-channel transistor P16 is connected in parallel to transistor P15. N-channel transistor N16 is connected between the drain of transistor P16 and potential $V_{SS}$. Signal CEi is input to each gate of p- and n-channel transistors P14 and N16.

Five inverters I24 to I28 are connected to the common node of the drains of p- and n-channel transistors P16 and N16 and p- and n-channel transistors P15 and N14. Inverter I29 is connected to the above node. An output from inverter I29 is input to each gate of p- and n-channel transistors P16 and N15.

An operation of latch mode change circuit 32 will be described below. In a general semiconductor IC, in order to decrease the current consumption when a chip is in an inoperative state, its operation is controlled by a chip enable signal (or chip selection signal). When the chip is set in an operative state by this chip enable signal and data is to be read, the chip enable signal is amplified by a buffer circuit in the chip and is transferred to each circuit in the chip, thereby controlling an address buffer circuit, an address decoder, a sense amplifier, and the like in an operative state.

With this arrangement, when the chip is switched from a non-selection state (inoperative state) to a selection state (operative state) and data is read from a memory cell selected by an input address, i.e., when an chip enable input (or chip selection signal) is changed and data is read, pulse signal generator 25 may be operated depending on the input state of an address signal. If pulse signal generator 25 is operated, a series of operations occur as described above, and hence data latch circuit 27 may latch erroneous data during an inoperative state of the chip. For this reason, when data is read by changing a chip enable input (or chip selection signal) in a non-selection state (signal $\overline{CEi}$ is at "1" level) of the chip, signal DHS of "1" level is output from latch mode change circuit 32 to control circuit 112 so that circuit 112 controls transfer control circuit 22 and data latch circuit 27 to be in an inoperative state, thereby preventing an operation error in a data read operation.

Figure 30:
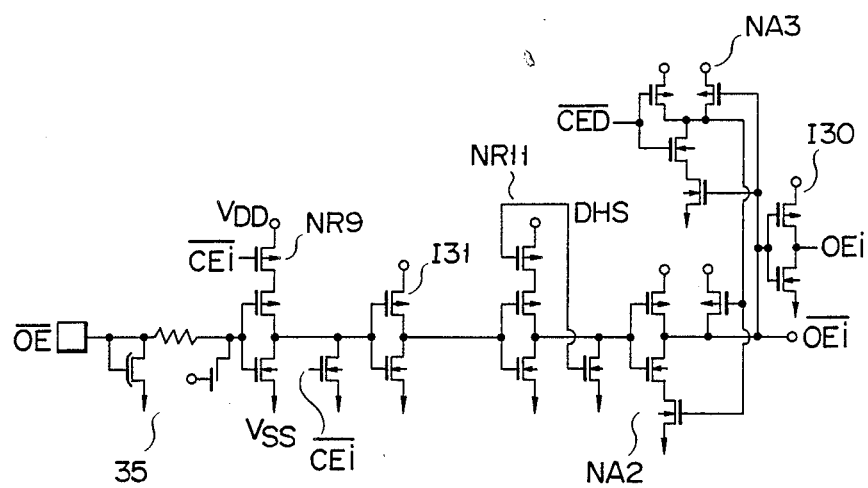
FIG. 30 is a circuit diagram showing a detailed arrangement of an output buffer control circuit in the semiconductor memory of the present invention in FIG. 27.

Output buffer control circuit 100 has in arrangement shown in, e.g., FIG. 30. More specifically, signal $\overline{OE}$ is input to one input terminal of two-input NOR gate NR9 through input preventive circuit 35, and signal CEi is input to the other input terminal of NOR gate NR9. An output from NOR gate NR9 is input to inverter I31. An output from inverter I31 is input to one input terminal of two-input NOR gate NR11, and signal DHS is input to the other input terminal thereof. An output from NOR gate NR11 is input to one input terminal of two-input NAND gate NA2. An output from NAND gate NA2 becomes signal $\overline{OEi}$, and at the same time, inverted by inverter I30 to become signal OEi. An output from NAND gate NA2 is input to one input terminal of two-input NAND gate NA3, and signal $\overline{CED}$ is input to the other input terminal thereof. An output from NAND gate NA3 is input to the other input terminal of NAND gate NA2.

In output buffer control circuit 100, when signals $\overline{CE}$, $\overline{CEi}$, DHS, and $\overline{CED}$ are respectively set at "0" level, "0" level, "0" level, and "1" level, signal $\overline{OE}$ is converted into $\overline{OEi}$ signal through NOR gate NR9, inverter I31, NOR gate NR11, and NAND gate NA2 and is output, and as further output through inverter I30 as signal OEi. Complementary signals $\overline{OEi}$ and OEi are supplied to output buffer circuit 23 as control signals.

When data is to be read upon a change in chip enable signal $\overline{CE}$ to "0" level, signal DHS is set at "1" level, and an output from NAND gate NR11 is set at "0" level. Before that, signal $\overline{CED}$ is set at "0" level, and an output from NAND gate NA3 is set at "1" level. As a result, the output of "0" level from NOR gate NR11 is output as signal $\overline{OEi}$ of "0" level through inverter I30. Complementary signals $\overline{OEi}$ and OEi are supplied to output buffer circuit 23 as control signals so that its output is kept in a high-impedance state. When signal DHS is set at "0" level, signals $\overline{OEi}$ and OEi are respectively set at "0" level and "1" level, thereby releasing the high-impedance state of the output of output buffer circuit 23.

An operation of the memory in FIG. 27 will be described below with reference to the timing chart of FIG. 31. When address input signal Add is changed so as to read data from a new memory cell, a memory cell corresponding to the address input is selected, and data from the selected memory cell is read by sense amplifier 7. In addition, the change in address input signal is detected by pulse signal generator 25, and signal P is kept at "1" level for a predetermined period of time. This operation is the same as that of the memory shown in FIG. 24. When signal P is input to control circuit 112, circuit 112 generates sense amplifier control signals (signal ST and its inverted signal $\overline{ST}$), transfer control circuit control signals (signal DLY and its inverted signal $\overline{DLY}$), data latch circuit control signals (signal LTH and its inverted signal $\overline{LTH}$), and output buffer control circuit control signal $\overline{CED}$ for predetermined periods of time, respectively. When signal P is set at "1" level, signal ST is set at "0" level. This causes signal LTH to be set at "1" level. Signal DLY is set at "0" level, after signal LTH becomes "1" level.

When signal P is set at "0" level, signal ST is set at "1" level after a lapse of a predetermined delay time. After signal ST becomes "1" level, signal DLY is set at "1" level. This causes signal LTH to be set at "0" level. That is, when signal P becomes "1" level, signal P, signal ST, signal LTH, and signal DLY are changed in the order named, whereas when signal P becomes "0" level, signal P, signal ST, signal DLY, and signal LTH are changed in the order named.

When signal ST is set at "0" level, sense amplifier 21 is kept in an inoperative state for a predetermined period of time and its output is set at "0" level. When signal LTH is set at "1" level, data latch circuit 27 is set in an operative state. As a result, circuit 27 latches an output from transfer control circuit 22, which corresponds to data in a memory cell before the address input signal is changed, for a predetermined period or time. This latched data is output through output buffer circuit 23.

Subsequently, signal DLY is set at "0" level, and transfer control circuit 22 is set in an inoperative state, so that the data from sense amplifier 21 is instantaneously output. In this case, in transfer control circuit 22, transfer gate TG3 is ON and clocked inverter C11 is in an active state (both of which are shown in FIG. 16) because of signal DLY of "0" level.

When the memory is operated at the above-described timings, even if sense amplifier 21 is set in an inoperative state and hence its output is set at "0" level, since transfer control circuit 22 is in an operative state and holds an output from sense amplifier 21 corresponding to data from a memory cell before an address input signal is changed, this data is latched by data latch circuit 27, and the output from transfer control circuit 22 corresponding to the data from the memory cell before the address input signal is changed is output through output buffer circuit 23 for a predetermined period of time. After the data is latched by data latch circuit 27, transfer control circuit 22 is set in an inoperative state.

At the same time that the above-described operation is performed, signal ST is set at "1" level at substantially the same timing as that when the data from the memory cell corresponding to an address after the address input signal is changed is set in a readable state. With this operation, sense amplifier 21 is set in an operative state again so that sense amplifier 21 outputs data of "1" level or "0" level in accordance with data from a memory cell corresponding to a newly selected address. Upon a change in output from sense amplifier 21, an output from transfer control circuit 22 (an operative state at this time) is changed. Signal DLY is set at "1" level at substantially the same timing as that when the output of transfer control circuit 22 is changed to "1" level or "0" level in accordance with the data from the memory cell corresponding to the newly selected address, thereby setting transfer control circuit 22 in an operative state.

When signal LTH is set at "0" level, data latch circuit 27 is set in an inoperative state. As a result, "1"- or "0"-level data from the memory cell corresponding to the newly selected address is output from output buffer circuit 23 in accordance with an output from transfer control circuit 22.

According to the above semiconductor memory shown in FIG. 27, since sense amplifier 21, transfer control circuit 22, data latch circuit 27, and output buffer control circuit 100 are controlled by different signals, the circuit operation margin can be increased. In addition, assume that an operation error occurs in the address input section in the above-described semiconductor memory because of a power source variation upon data output, and signal P is set at "1" level. In this case, transfer control circuit 22 is set in an inoperative state, and data latch circuit 27 is set in an operative state. As a result, data latch circuit 27 latches data from a memory cell corresponding to an address prior to the operation error and outputs it to output buffer circuit 23. Even if signal P is set at "0" level after a predetermined period of time, since an output from sense amplifier 21 coincides with the latched data in data latch circuit 27, the output from output buffer circuit 23 is not changed from "1" level to "0" level, and vice versa. Therefore, an operation error in the IC chip can be prevented.

Similarly, when noise is carried by an address input data, and address change detection circuit 11 detects this change so as to set signal P at "1" level, since data latch circuit 27 is kept in an operative state during this period so as to latch previous data and keep outputting it through output buffer circuit 27, no erroneous data is output, and no operation error occurs in the IC chip.

That is, according to the arrangement in FIG. 27, a highly reliable semiconductor IC can be obtained. Accordingly, the semiconductor IC can prevent an operation error in an internal circuit of the IC due to a power source variation or external noise. In addition, the driving capacity or an output buffer transistor can be set to be large, and the operation margin of the IC chip with respect to the power source variation and the noise can be increased while a high data read rate is maintained.

FIG. 32 is a block diagram showing an overall arrangement of a semiconductor memory. This semiconductor memory is different from the semiconductor memory shown in FIG. 4 in that it comprises a pulse width detection circuit 26. Pulse width detection circuit 26 outputs a pulse signal when the pulse width of the pulse signal generated by pulse signal generator 25 exceeds a predetermined width. Operations of memory cell array 18, sense amplifier 21, and output buffer circuit 23 are controlled by an output pulse signal from pulse signal generator 25. For example, a precharge operation of each bit line 19 in memory cell array 18, a sensing operation of data in sense amplifier 21, and an output operation of the data in output buffer circuit 23 are respectively started on the basis of this pulse signal. On the other hand, an operation of transfer control circuit 22 is controlled by an output pulse signal from pulse width detection circuit 26. More specifically, upon reception of an output pulse from pulse width detection circuit 26, transfer control circuit 22 quickly transfers detection data from sense amplifier 21 to output buffer circuit 23. The pulse width of a signal generated by pulse signal generator 25 is set so as to allow memory cell array 18, sense amplifier 21, and output buffer circuit 23 to be operated with a sufficient margin.

Assume that an operation error occurs in column or row address buffer 12 or 13 by power source noise when data is output from output buffer circuit 23 in the above arrangement. More specifically, assume that an internal column or row address signal is temporarily inverted due to a variation in power source voltage or ground voltage applied to column or row address buffer 12 or 13. At this time, pulse signal generator 25 generates a pulse signal in the same manner as in a case wherein an address input is normally changed. Upon reception of this pulse signal, operations of memory cell array 18, sense amplifier 21, and output buffer circuit 23 are respectively started in the same manner as in a case wherein an address input is normally changed.

The pulse signal generated by pulse signal generator 25 in this case has a pulse width sufficiently smaller than that of a pulse signal generated when an address input is normally changed. As a result, pulse width detection circuit 26 detects that the pulse width of the pulse signal generated from pulse signal generation circuit 25 is smaller than a predetermined value, and hence does not generate a pulse signal. Since no pulse signal is supplied to transfer control circuit 22, even if sense amplifier 21 detects new undesired data, this detection data is not supplied to output buffer circuit 23. Consequently, the level of data already output from output buffer circuit 23 is not changed, thus preventing an operation error such as outputting of undesired data as in the conventional technique.

FIG. 33 is a circuit diagram showing a detailed one-bit arrangement of column or row address buffer 12 in the circuit according to the above-described embodiment. One-bit address signal Ai supplied to address input terminal 11 is caused to pass through an even number (four as shown in FIG. 33) of CMOS inverters 31, 32, 33, and 34 so as to be output as internal address signal Ai having the sam logic level as that of internal address signal Ai. In contrast to this, address signal Ai is caused to pass through an odd number (three as shown in FIG. 33) of CMOS inverters 31, 32, and 35 so as to be output a internal address signal $\overline{Ai}$ having a logic level opposite to that of signal Ai.

Pulse signal generator 25 is the same arrangement of pulse signal generator as shown in FIG. 10. Explanation of pulse signal generator 25 shown in FIG. 32 is omitted.

FIG. 34 is a circuit diagram showing a detailed arrangement of an address change detection circuit used in pulse signal generator 25 shown in FIG. 32. FIG. 35 is a timing chart for explaining an operation of the address change detection circuit. The address change detection circuit comprises delay circuit 51 for delaying one-bit internal address signal Ai by a predetermined period of time, delay circuit 52 for delaying one-bit internal address signal $\overline{Ai}$ by a period of time equal to that of delay circuit 51, CMOS NAND gate circuit 53 for receiving delay output AiD from delay circuit 51 and internal address signal $\overline{Ai}$, CMOS NAND gate circuit 54 for receiving delay output $\overline{AiD}$ from delay circuit 52 and internal address signal Ai, and CMOS NAND gate circuit 55 for outputting signal Pi on the basis of outputs from NAND gate circuits 53 and 54.

In the timing chart of FIG. 35, when a pair of internal address signals Ai and $\overline{Ai}$ are changed upon normal change in address input, a pulse signal having sufficiently large pulse width T1 is generated as output Pi. In contrast to this, when internal address signals Ai and $\overline{Ai}$ are changed due to noise, a pulse-like signal having pulse width T2 smaller than pulse width T1 is generated.

Figure 36:
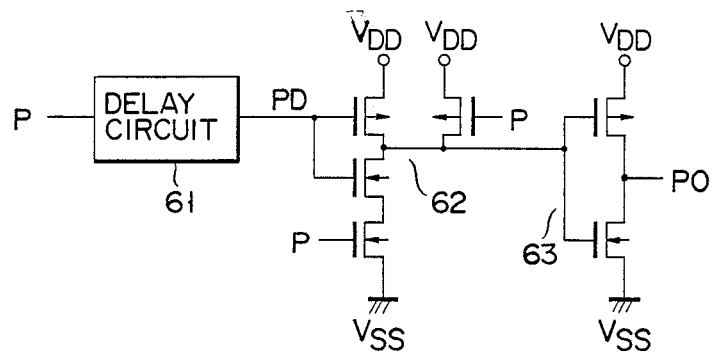
FIG. 36 is a circuit diagram showing a detailed arrangement of a pulse width detection circuit in the semiconductor memory of the present invention in FIG. 32.
Figure 37:
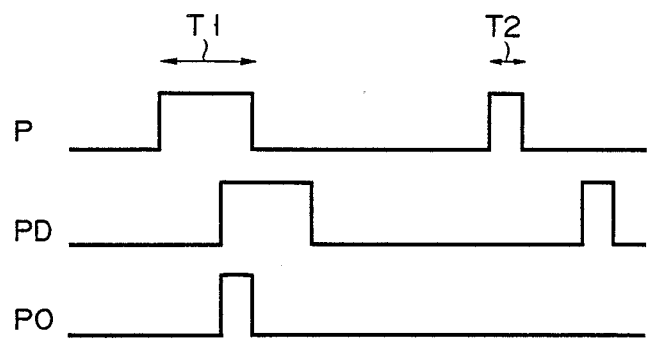
FIG. 37 is a timing chart for explaining an operation of the pulse width detection circuit in FIG. 36.

FIG. 36 is a circuit diagram showing a detailed arrangement of pulse width detection circuit 26 in the circuit of the above embodiment. FIG. 37 is a timing chart for explaining an operation of the pulse width detection circuit. The pulse width detection circuit comprises delay circuit 61 for delaying output P from pulse signal generator 25 by a predetermined period of time, CMOS NAND gate circuit 62 for receiving delay output PD from delay circuit 61 and signal P before it is delayed by delay circuit 61, and CMOS inverter 63 for inverting a output from NAND gate circuit 62 and outputting signal PO.

In the timing chart of FIG. 37, when an address input is normally changed, and a pulse-like signal having sufficiently large pulse width T1 is input as output P, output PO is generated. On the contrary, when a pulse-like signal having small pulse width T2 is input due to noise, a pulse-like signal is not generated at PO. Therefore, a pulse signal is output from pulse width detection circuit 26 only when an address input is normally changed. With this operation, an operation of transfer control circuit 22 is controlled.

FIG. 38 is a circuit diagram showing another detailed arrangement of pulse width detection circuit 26. FIG. 39 is a timing chart for explaining an operation of the circuit in FIG. 38. This pulse width detection circuit comprises CMOS inverter 71 for inverting output P from pulse signal generator 25, resistor circuit 72 constituted by n- and p-channel MOS transistors having parallel-connected source-drain paths and each having one terminal connected to the output terminal of inverter 71, capacitor 73 inserted between the other terminal of resistor circuit 72 and ground voltage VSS, p-channel MOS transistor 74 having a source-drain path inserted between the other terminal of resistor circuit 72 and the node of power source voltage $V_{DD}$ and a gate for receiving signal P, CMOS inverter 75 connected to the other terminal of resistor circuit 72, flip-flop circuit 76 constituted by two NOR gate circuits and adapted to receive outputs from CMOS inverter 75 and delay circuit 79 (to be described later), CMOS inverter 77 for inverting an output from flip-flop circuit 76 and obtaining output PO, CMOS inverter 78 for inverting an output from flip-flop circuit 76, and delay circuit 79 for delaying an output from inverter 78 and supplying it to flip-flop circuit 76.

In this circuit, when signal P is set at "0" level, capacitor 73 is charged to "1" level through transistor 74. As shown in the timing chart of FIG. 39, when an address input is normally changed, and a pulse-like signal having sufficiently large pulse width T1 is input as signal P, capacitor 73 is discharged through resistor circuit 72 and the n channel MOS transistor in inverter 71, so that the potential of signal a at the other terminal of resistor circuit 72 is lowered to a sufficiently low value. As a result, output b of inverter 75, to which signal a is supplied, is kept at "1" level for a predetermined period of time. However, when a pulse like signal having small pulse width T2 due to noise is input, the discharging operation is finished before the potential of signal a is sufficiently lowered. Consequently, output b from inverter 75 is kept at "0" level. After output b from inverter 75 goes to "1" level, flip-flop circuit 76 is reset, so that output c from flip-flop circuit 76 goes to "1" level. Thereafter, an output from inverter 78 goes to "1" level. In addition, output d from delay circuit 79 goes to "1" level after a delay time by delay circuit 79 has elapsed. With this operation, flip-flop circuit 76 is set, and output c therefrom goes to "1" level. Therefore, a pulse-like signal having a level opposite to that of signal c can be obtained as signal PO obtained as an output from inverter 77 only when an address input is normally changed.

Figure 40:
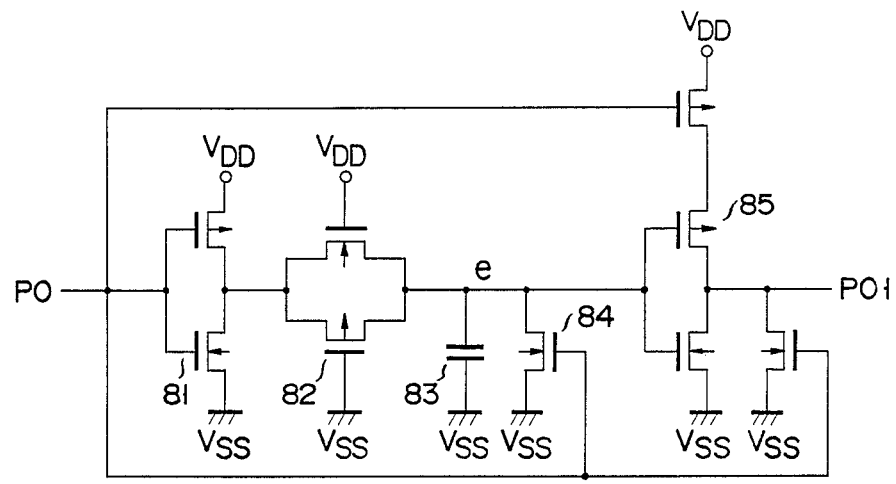
FIG. 40 is a circuit diagram showing a pulse width detection circuit having an arrangement different from the arrangements of the pulse width detection circuits in FIGS. 34 and 38.
Figure 41:
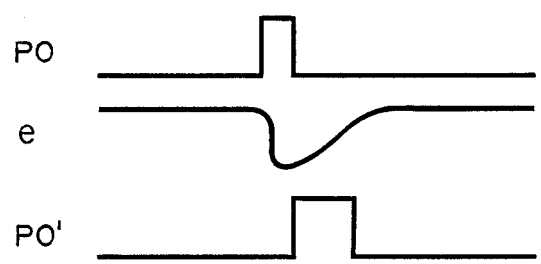
FIG. 41 is a timing chart for explaining an operation of the pulse width detection circuit in FIG. 40.

FIG. 40 is a circuit diagram showing another detailed arrangement of pulse width detection circuit 26. This pulse width detection circuit is used in combination with pulse width detection circuit 26 shown in FIG. 36. FIG. 41 is a timing chart for explaining an operation of the circuit in FIG. 40.

This pulse width detection circuit comprises CMOS inverter 81 for inverting output PO from the pulse width detection circuit shown in FIG. 36, resistor circuit 82 constituted by n- and p-channel MOS transistors having parallel-connected source-drain paths and each having one terminal connected to the output terminal of inverter 81, capacitor 83 inserted between the other terminal of resistor circuit 82 and ground voltage $V_{SS}$, n-channel MOS transistor 84 connected to the other terminal of resistor circuit 82 and having a gate for receiving output PO from the pulse width detection circuit shown in FIG. 36, and NOR gate circuit 85 for receiving a signal from the other terminal of resistor circuit 82 and output PO from the pulse width detection circuit in FIG. 36.

In this circuit, when input signal PO is at "0" level, capacitor 83 is charged to "1" level through the p-channel MOS transistor in inverter 81. As shown in the timing chart of FIG. 41, when output PO goes to "1" level, transistor 84 is turned on, so that the charge stored in capacitor 83 is quickly discharged through transistor 84. As a result, signal e at the other terminal of resistor circuit 82 is set to $V_{SS}$. A pulse-like signal having a predetermined pulse width is then obtained at output PO' of CMOS NOR gate circuit 85 after output PO from pulse width detection circuit 26 goes to "0" level. Therefore, by using pulse width detection circuit in FIG. 40 in combination with the pulse width detection circuit in FIG. 36, transfer control circuit 22 is started at a delayed timing so that operation margins of memory cell array 18 and sense amplifier 21 are increased.

FIG. 42 is a circuit showing a detailed arrangement of transfer control circuit 22 shown in the block diagram of the semiconductor memory of the present invention in FIG. 32. The transfer control circuit comprises switch element 91 constituted by an n-channel MOS transistor having a source-drain path inserted between sense amplifier 21 and output buffer circuit 23 and a gate for receiving signal PO obtained by the pulse width detection circuit shown in FIG. 36 or 38, or signal PO1 obtained by the pulse width detection circuit shown in FIG. 40, and noise canceller 94 constituted by, e.g., resistor 92 and capacitor 93, and inserted between sense amplifier 21 and output buffer circuit 23.

An operation of the semiconductor memory shown in FIG. 32 will be described below. When an input address is changed, and a new memory cell is selected in memory cell array 18 in FIG. 32, data from the selected memory cell is detected by sense amplifier 21. In this case, since a pulse signal is generated by pulse width detection circuit 26, switch element 91 in transfer control circuit 22 is turned on. As a result, the data detected by sense amplifier 21 is quickly transferred to output buffer circuit 23.

In contrast to this, if a new memory cell is selected in memory cell array 18 because of an operation error in column or row address buffer 12 or 13, no pulse signal is generated by pulse width detection circuit 26, so that switch element 91 in the transfer control circuit is not turned on. In this case, the data detected by sense amplifier 21 is canceled by noise canceller 94 and hence as not transferred to output buffer circuit 23. Since the new data is not transferred, the level of data previously output from data output terminal 24 is maintained even if an output pulse signal is supplied from pulse signal generator 25.

FIG. 43 is a circuit diagram showing another detailed arrangement of transfer control circuit 22 in the circuit of the above-described embodiment. This circuit comprises CMOS inverter 101 for inverting detection data from sense amplifier 21, CMOS inverter 102 for inverting an output from inverter 101, CMOS inverter 103 for inverting an output from inverter 102, CMOS inverter 104 for inverting an output from inverter 103, CMOS logic circuit 105 which is operated only when signal PO obtained by the pulse width detection circuit shown in FIG. 36 or 38, or signal PO1 obtained by the pulse width detection circuit shown in FIG. 13 is "1" level so as to invert an output from inverter 104, capacitor 107 connected between common output node 106 of logic circuit 105 and inverter 104 and ground voltage $V_{SS}$, CMOS inverter 108 for receiving a signal from node 106, CMOS logic circuit 109 which is operated only when signal PO or PO1 is at "1" level so as to invert an output from inverter 102, capacitor 111 connected between common node 110 of CMOS logic circuit 109 and inverter 108 and ground voltage $V_{SS}$, and CMOS inverter 112 for receiving a signal from node 110. An output from inverter 11 is supplied to output buffer circuit 23.

An operation of the circuit having such an arrangement will be described below. When an input address is changed, and a new memory cell is selected in memory cell array 18 in FIG. 32, data from the selected memory cell is detected by sense amplifier 21. In this case, since a pulse signal is generated by pulse width detection circuit 26, CMOS logic circuits 105 and 109 are respectively operated as inverters. As a result, capacitor 107 is quickly charged and discharged in response to outputs from inverter 104 and CMOS logic circuit 105, and capacitor 111 is quickly charged and discharged in response to outputs from inverter 108 and CMOS logic circuit 109. Thus, the detection data supplied to inverter 101 is output from inverter 112 within a short period of time, and is quickly transferred to output buffer circuit 23.

In contrast to this, when a new memory cell as selected in memory cell array 18 because of an operation error in column or row address buffer 12 or 13, no pulse signal is generated from pulse width detection circuit 26. Therefore, CMOS logic circuits 105 and 109 are not operated. In this case, a data change detected by sense amplifier 21 is mostly absorbed by nodes 106 and 110, and hence this data change is not transferred to output buffer circuit 23.

FIG. 44 is a block diagram showing an arrangement of another embodiment when the present invention is applied to a semiconductor memory such as a RAM. In the RAM of this embodiment, latch circuit 27 is arranged between sense amplifier 21 and output buffer circuit 23 in place of transfer control circuit 22. Latch circuit 27 latches detection data from sense amplifier 21 and outputs it to output buffer circuit 23 when a pulse signal is output from pulse width detection circuit 26. Therefore, when a new memory cell is selected in memory cell array 18 because of an operation error in column and row address buffer 12 or 13, latch circuit 27 does not latch the new data, and hence output data from output buffer circuit 23 is not changed.

FIG. 45 is a circuit diagram showing a detailed arrangement of a delay circuit in the semiconductor ICs of the present invention shown in FIGS. 4, 17, 23, 29, 32, and 37. The same effects as described above can be obtained by using the delay circuit shown in FIG. 43. FIG. 47 is a timing chart of an operation of the delay circuit in FIG. 43.

Note that the present invention is not limited to the above-described embodiments, and various changes and modifications can be made.

What is claimed is:

1. A semiconductor integrated circuit comprising:
data storage means;
pulse signal generating means for detecting a change in an address input and generating a first pulse signal;
data detecting means for detecting data stored in said data storage means corresponding to the address input;
data output means for externally outputting the data detected by said data detecting means; and
data output operation control means for controlling a level of the data output from said data output means so as not to be changed when a pulse width of the first pulse signal generated by said pulse signal generating means is smaller than a predetermined value, and for causing said data output means to set the level of the output data on the basis of the data detected by said data detecting means when the pulse width is larger than the predetermined value.

2. A circuit according to claim 1, wherein said data output operation control means comprises pulse width detecting means for outputting a second pulse signal when the pulse width of the first pulse signal output from said pulse signal generating means is larger than the predetermined value, and
data transfer control means, arranged between said data detecting means and said data output means, for transferring the detection data from said data detecting means to said data output means when the second pulse signal is input from said pulse width detecting means.

3. A circuit according to claim 2, wherein said data transfer control means comprises an n-channel MOS transistor, a source-drain path of which is inserted between said data detecting means and an output buffer circuit, and a gate of which receives the signal from said pulse width detecting means, and a noise canceller constituted by a resistor and a capacitor and inserted between said data detecting means and said output buffer circuit.

4. A circuit according to claim 2, wherein said data transfer control means comprises a CMOS inverter for inverting the detection data from said data detecting means, a first CMOS inverter for inverting an output from said CMOS inverter, a second CMOS inverter for inverting an output from said first CMOS inverter, a third CMOS inverter for inverting an output from said second CMOS inverter, a first CMOS logic circuit which is operated to invert an output from said third CMOS inverter only when the signal obtained by said pulse width detecting means is set at "1" level, a first capacitor connected between a first common output node of said CMOS logic circuit and said third CMOS inverter and a ground voltage, a fourth CMOS inverter for receiving a signal from the first common output node, a second CMOS logic circuit which is operated to invert the output from said first CMOS inverter only when the signal obtained by said pulse width detecting means as set at "1" level, a second capacitor connected between a second common output node of said second CMOS logic circuit and said fourth CMOS inverter and a ground voltage, and a fifth CMOS inverter for receiving a signal from the second common output node.

5. A circuit according to claim 1, wherein said data output operation control means comprises:
pulse width detecting means for outputting a second pulse signal when the pulse width of the first pulse signal generated by said pulse signal generating means is larger than the predetermined value, and
data latch means, arranged between said data detecting means and said data output means, for latching the detection data from said data detecting means by using the second pulse signal from said pulse width detecting means and for outputting the latched data to said data output means.

6. A circuit according to claim 5, wherein said pulse width detecting means comprises a delay circuit for delaying the first pulse signal from said pulse signal generating means by a predetermined period of time, a CMOS NAND gate circuit for receiving a first signal prior to the delay operation of said delay circuit, and a CMOS inverter for inverting an output from said NAND gate circuit and outputting a second signal.

7. A circuit according to claim 5, wherein said pulse width detecting mean comprises a CMOS inverter for inverting the output from said pulse signal generating means, a resistor circuit constituted by n- and p-channel MOS transistors having parallel-connected source-drain paths, one terminal of said resistor circuit being connected to the other terminal of said inverter, a capacitor inserted between the other terminal of said resistor circuit and a ground voltage, a p-channel MOS transistor, a source-drain path of which is inserted between the other terminal of said resistor circuit and a node of a power source voltage, and a gate of which receives the signal, a CMOS inverter connected to other terminal of said resistor circuit, a flip-flop circuit, constituted by two NOR gate circuits, for receiving an output from said CMOS inverter and an output from a delay circuit, a CMOS inverter for inverting an output from said flip-flop circuit and obtaining the inverted output, a CMOS inverter for inverting the output from said flip-flop circuit, and said delay circuit for delaying an output from said inverter by a predetermined period of time and supplying the delayed output to said flip-flop circuit.

8. A circuit according to claim 5, wherein said pulse width detecting means comprises a delay circuit for delaying the first pulse signal from said pulse signal generating means by a predetermined period of time, a CMOS NAND gate circuit for receiving a delayed output from said delay circuit and the first pulse signal prior to the delay operation of said delay circuit, a first CMOS inverter for inverting an output from said NAND gate circuit and outputting the second pulse signal, a second CMOS inverter for inverting an output from said first CMOS inverter, a resistor circuit constituted by n- and p-channel MOS transistors having parallel-connected source-drain paths, one terminal of said resistor circuit being connected to an output terminal of said second inverter, a capacitor connected between the other terminal of said resistor circuit and ground voltage, an n-channel MOS transistor having a gate connected to the other terminal of said resistor circuit, said gate receiving the output from said first CMOS inverter, and a CMOS NOR gate circuit for receiving a signal from the other terminal of said resistor circuit and the output from said first CMOS inverter.

9. A circuit according to claim 1, further comprising column and row address buffer circuits each including an input terminal for receiving the address input, an even number of inverters for allowing the address input to pass therethrough and outputting an internal address signal having the same logic level as that of the address input, and an inverter, having an input terminal connected to an output terminal of one of said inverters, which is located at an even-numbered position counted from said input terminal, for outputting an internal address signal having a logic level opposite to that of the address input.

10. A circuit according to claim 1, wherein said pulse signal generating means comprises a plurality of address change detection circuits for detecting changes in a pair of complementary internal address signals respectively output from said column and row address buffer circuits and outputting pulse signals, and an OR gate circuit for outputting a pulse signal on the basis of the outputs from said address change detection circuits.

11. A circuit according to claim 10, wherein each of said address change detection circuits comprises a first delay circuit for delaying a one-bit internal address signal by a predetermined period of time, a second delay circuit for delaying the one-bit internal address signal by the same period of time as that of said first delay circuit, a first CMOS NAND gate circuit for receiving a delayed output from said first delay circuit and the internal address signal, a second CMOS NAND gate circuit for receiving a delayed output from said second delay circuit and the internal address signal, and a CMOS NAND gate circuit for generating a signal on the basis of outputs from said first and second NAND gate circuits.

12. A circuit according to claim. 1, further comprising pulse width detecting means comprises a delay circuit for delaying the first pulse signal from said pulse signal generating means by a predetermined period of time, a CMOS NAND gate circuit for receiving a delayed output from said delay circuit and the first pulse signal prior to the delay operation of said delay circuit, and a CMOS inverter for inverting an output from said NAND gate circuit and outputting the second pulse signal.

13. A circuit according to claim 1, further comprising pulse width detecting means including a CMOS inverter for inverting an output from said pulse signal generating means, a resistor circuit constituted by n- and p-channel MOS transistors having parallel-connected source-drain paths, one terminal of said resistor circuit being connected to an output terminal of said inverter, a capacitor inserted between the other terminal of said resistor circuit and a ground voltage, a p-channel MOS transistor, a source-drain path of which is inserted between the other terminal of said resistor circuit and a node of a power source voltage, and a gate of which receives the signal, a CMOS inverter connected to the other terminal of said resistor circuit, a flip-flop circuit, constituted by two NOR gate circuits, for receiving an output from said CMOS inverter and an output from a delay circuit, an CMOS inverter for inverting an output from said flip-flop circuit and obtaining the inverted output, a CMOS inverter for inverting the output from said flip-flop circuit, and said delay circuit for delaying the output from said inverter by a predetermined period of time and supplying the delayed output to said flip-flop circuit.

14. A circuit according to claim 1, further comprising pulse width detecting means including a delay circuit for delaying the first pulse signal from said pulse signal generating means by a predetermined period of time, a CMOS NAND gate circuit for receiving a delayed output from said delay circuit and the first pulse signal prior to the delay operation of said delay circuit, a first CMOS inverter for inverting an output from said NAND gate circuit and outputting the second pulse signal, a second CMOS inverter for inverting an output from said first CMOS inverter, a resistor circuit constituted by n- and p-channel MOS transistors having parallel-connected source-drain paths, one terminal of said resistor circuit being connected to an output terminal of said second inverter, a capacitor inserted between the other terminal of said resistor circuit and a ground voltage, an n-channel MOS transistor having a gate connected to the other terminal of said resistor circuit, said gate receiving the output from said first CMOS inverter, and a CMOS NOR gate circuit for receiving a signal from the other terminal of said resistor circuit and the output from said first CMOS inverter.

15. A semiconductor integrated circuit, comprising:
   data storage means;
   pulse signal generating means for detecting a change in an address input and generating a first pulse signal;
   data detecting means for detecting data stored in said data storage means corresponding to the address input:
   data transfer means connected to said data detecting means and having a first response time and a second response time longer than the first response time;
   data output means for externally outputting data transferred by said data transfer means; and
   pulse width detecting means for generating a second pulse signal when the first pulse signal generated by said pulse signal generating means is larger than a predetermined value,
   wherein said data transfer means is controlled by the second pulse signal generated by said pulse width detecting means, the data is transferred to said data output means within the first response time when the second pulse signal is generated by said pulse width detecting means, and the data is transferred to said data output means within the second response time when the second pulse signal is not generated by said pulse width detecting means.

16. A semiconductor integrated circuit comprising:
   an address change detection circuit for detecting a change in an address input signal and, generating a pulse signal for a predetermined period of time;
   a memory cell for storing data;
   a data detection circuit for detecting the data stored in said memory cell;
   a transfer control circuit connected to said data detection circuit and having a delay time controlled by the pulse signal from said address change detection circuit;
   an output buffer circuit connected to said transfer control circuit; and
   an output buffer control circuit which is controlled by the pulse signal from said address change detection circuit so as to cause said output buffer circuit not to output data output from said data detection circuit for said predetermined period of time.

17. A circuit according to claim 16, wherein the pulse signal generated by said address change detection circuit is generated with a predetermined delay time with respect to a time when the address input signal is changed, and is continuously generated at least until the data stored in said memory cell reaches said output buffer circuit after being detected by said data detection circuit in accordance with the address input signal.

18. A circuit according to claim 16, wherein said predetermined period of time for said address change detection circuit to output the pulse signal is set to be not more than a time interval between when said output buffer circuit starts outputting data after a capacitor of 100 pF is connected to said buffer circuit and when the data is completely output.

19. A circuit according to claim 16, wherein said address change detection circuit comprises a first inverter for changing a level of an output node to a first level by activating an internal enable signal, a transistor for changing the level of the output node of said first inverter to a second level by changing the address input signal, and a delay circuit for changing the level of the output node of said first inverter to the first level after a predetermined period of time.

20. A circuit according to claim 18, wherein said transfer control circuit comprises a delay circuit for, when a signal except for normal address input signal is input from said data detection circuit, delaying a noise output by a time longer than a time during which the signal except for the normal address signal is input, and a bypass circuit for substantially instantaneously outputting the data from said data detection circuit when the pulse signal from said address change detection circuit is changed.

21. A circuit according to claim 16, wherein said output buffer control circuit comprises a first NOR gate for receiving an output chip enable control signal and an internal chip enable signal, a second NOR gate for receiving a ground potential as one input and an output from said first NOR gate as the other input, a third NOR gate for receiving the pulse signal from said address change detection signal as one input and an output from said second NOR gate as the other input, a first inverter for inverting an output from said third NOR gate, and a second inverter for inverting an output from said first inverter and outputting an output signal which is complementary to the output signal from said first inverter.

22. A circuit according to claim 16, wherein said transfer control circuit comprises delay circuit means and circuit means connected in parallel with said delay circuit means and having a delay time shorter than that of said delay circuit means, and is controlled to output a signal from said data detection circuit through said circuit means while the pulse signal from said address change detection circuit is output and, otherwise, to output a signal from said data detection circuit through said delay circuit means.

23. A circuit according to claim 16, wherein said delay time of said transfer control circuit is set to be short for a predetermined period of time by using the pulse signal from said address change detection circuit, and the output from said data detection circuit is output from said output buffer circuit.

24. A semiconductor integrated circuit comprising:
   an address change pulse generator for detecting a change in an address input signal and generating a pulse signal;
   a memory cell for storing data;
   a control circuit for receiving the pulse signal from said address change pulse generator and outputting a sense amplifier control signal, a transfer control circuit control signal, and an output buffer control circuit control signal;
   a data detection circuit, responsive to the sense amplifier control signal from said control circuit, for detecting data stored in said memory cell;
   a transfer control circuit connected to said data detecting circuit and having a delay time responsive to the transfer control circuit control signal from said control circuit; and
   an output buffer circuit connected to said transfer control circuit and responsive to the output buffer control circuit control signal from said control circuit so as not to output data input from said data detection circuit.

25. A circuit according to claim 24, wherein the transfer control circuit control signal is set to be generated after generation of at least the output buffer control circuit control signal for controlling said output buffer circuit and not to be generated after generation of the sense amplifier control signal for controlling said data detection circuit, and the delay time of said transfer control circuit is controlled to be short while the transfer control circuit control signal is generated.

26. A circuit according to claim 24, wherein said control circuit comprises an address buffer equivalent circuit, a row decoder equivalent circuit, a word line equivalent circuit, and a timing detection circuit, which are operated to output the sense amplifier control signal at the same timing as that when a predetermined word line in a memory cell array is selected after the address input signal is changed or a chip is set at a selection state, a sense amplifier control signal generator for outputting the sense amplifier control signal, an output buffer control circuit control signal generator for outputting the output buffer control circuit control signal upon reception of the sense amplifier control signal from said sense amplifier control signal generator, and a transfer control circuit control signal generator for outputting the transfer control circuit control signal upon reception of the output buffer control circuit control signal.

27. A circuit according to claim 24, wherein said data detection circuit comprises a CMOS transfer gate having first and second gate transistors arranged between a column line and a dummy column line, said first gate transistor receiving the data detection circuit control signal and said second gate transistor receiving an inverted signal thereof, a transistor having one terminal of a conductive path connected to a power source and a gate for receiving the inverted signal, and a data detection circuit section, arranged between the column line and the dummy column line, for receiving a column line potential and a dummy column line potential.

28. A circuit according to claim 24, wherein said output buffer controlled circuit comprises a first NOR gate having one input terminal for receiving an internal chip enable signal and the other input terminal for receiving an output enable signal, a second NOR gate having one input terminal for receiving a ground potential and the other input terminal for receiving an output from said first NOR gate, a third NOR gate having one input terminal for receiving the output buffer control circuit control signal and the other input terminal for receiving an output from said second NOR gate, a NAND gate having one input terminal for receiving the transfer control circuit control signal and the other input terminal for receiving an output from said third NOR gate, and an inverter for receiving an output from said NAND gate.

29. A circuit according to claim 24, wherein said transfer control circuit comprises delay circuit means and circuit means connected in parallel with said delay circuit means and having a delay time shorter than that of said delay circuit means, and is controlled to output a signal from said data detection circuit through said circuit means while the pulse signal from said address change pulse generator is output and, otherwise, to output a signal from said data detection circuit through said delay circuit means.

30. A circuit according to claim 24, wherein said data detection circuit comprises a data detection circuit section for detecting contents of data of said memory cell on the basis of a potential difference between a potential of a column line changed in accordance with the data and a reference potential of a dummy column line and a transistor connected between the column line and the dummy column line, said transistor being controlled to be ON while the pulse signal output from said address change pulse generator is generated and, otherwise, to be OFF.

31. A circuit according to claim 24, wherein said delay time of said transfer control circuit is set to be short for a predetermined period of time by using the pulse signal from said address change detection circuit, and the output from said data detection circuit is output from said output buffer circuit.

32. A semiconductor integrated circuit comprising:
an address change detection circuit for detecting a change in an address input signal and generating a pulse signal;
a memory cell for storing data:
a data detection circuit for detecting data stored in said memory cell;
a transfer control circuit connected to said data detection circuit and having a delay time controlled by the pulse signal from said address change detection circuit;
a data latch circuit which is connected to said transfer control circuit and a latch operation of which is controlled by the pulse signal from said address change detection circuit; and
an output buffer circuit for outputting the data stored in said memory cell.

33. A circuit according to claim 32, wherein said data latch circuit receives the pulse signal from said address change detection circuit and latches the data in said memory cell designated by an address input signal before the address input signal is changed.

34. A circuit according to claim 32, wherein said data latch circuit comprises series-connected first, second, and third inverters, a first clocked inverter connected to an input terminal of said first inverter, and a second clocked inverter, connected between the input terminal of said first inverter and an input terminal of said second inverter, for latching the data in accordance with the pulse signal from said address change detection circuit.

35. A circuit according to claim 32, wherein said transfer control circuit comprises delay circuit means and circuit means connected to said delay circuit means and having a delay time shorter than that of said delay circuit means, and is controlled to output a signal from said data detection circuit through said circuit means while the pulse signal from said address change detection circuit is output and, otherwise, to output the signal from said data detection circuit through said delay circuit means.

36. A circuit according to claim 32, wherein a delay time of said transfer control circuit is set to be short for a predetermined period of time by using the pulse signal from said address change pulse generator, and the output from said data detection circuit is output from said output buffer circuit while the delay time is set to be long after the predetermined period of time.

37. A semiconductor integrated circuit comprising:
an address change pulse generator for detecting a change in an address input signal and generating a pulse signal;
a memory cell for storing data;
a control circuit for receiving the pulse signal from said address change pulse generator and generating a sense amplifier control signal, a transfer control circuit control signal, a data latch circuit control signal, and an output buffer control circuit control signal;

a data detection circuit, responsive to the sense amplifier circuit control signal, for detecting data stored in said memory cell;

a transfer control circuit connected to said data detection circuit and having a delay time responsive to the transfer control circuit control signal from said control circuit;

a data latch circuit which is connected to said transfer control circuit and a latch operation of which is controlled by the data latch circuit control signal from said control circuit;

a chip enable buffer circuit for amplifying/shaping a chip enable signal and outputting an internal chip enable signal;

a latch mode change circuit for generating a control signal for controlling said control circuit in response to the internal chip enable signal from said chip enable buffer circuit;

an output buffer control circuit for outputting a control signal in response to the output buffer control circuit control signal from said control circuit and a control signal from said latch mode change circuit; and an output buffer circuit responsive to the signal from said output buffer control circuit.

38. A circuit according to claim 37, wherein the pulse signal for controlling the delay time is generated at least after a latch operation of said data latch circuit is performed, and controls the delay time of a delay circuit to be short while the pulse signal for controlling the delay time is generated.

39. A circuit according to claim 38, wherein said delay circuit comprises delay circuit means and circuit means connected in parallel with said delay circuit means and having a delay time shorter than that of said delay circuit means, and is controlled to output a signal from said data detection circuit through said circuit means while the pulse signal from said address change pulse generator is output and, otherwise, to output a signal from said data detection circuit through said delay circuit means.

40. A circuit according to claim 38, wherein a delay time of said delay circuit is set to be short for predetermined period of time by using the pulse signal from said address change pulse generator, and the output from said data detection circuit is output from said, output buffer circuit while the delay time is set to be long after the predetermined period of time.

41. A circuit according to claim 37, further comprising means for controlling the delay time of said delay circuit by using the control signal generated by said latch mode change circuit to be short for a predetermined period of time after said semiconductor integrated circuit is set in a data readable state by an external input signal, and for setting said data latch circuit in a non-latched state.

42. A circuit according to claim 37, wherein said data detection circuit comprises a data detection circuit section for detecting contents of data of said memory cell on the basis of a potential difference between a potential of a column line changed in accordance with the data and a reference potential of a dummy column line and a transistor connected between the column line and the dummy column line, said transistor being controlled to be ON while the pulse signal output from said address change pulse generator is generated and, otherwise, to be OFF.

43. A circuit according to claim 37, wherein said control circuit comprises an address buffer equivalent circuit, a row decoder equivalent circuit, a word line equivalent circuit, and a timing detection circuit which are operated to output the sense amplifier control signal at the same timing as that when a predetermined word line in a memory cell array is selected after the address input signal is changed or a chip is set in a selection state, a sense amplifier control signal generator for outputting the sense amplifier control signal, an output buffer control circuit control signal generator for outputting the output buffer control circuit control signal upon reception of the sense amplifier control signal from said sense amplifier control signal generator, and a data latch circuit control signal generating section for setting said data latch circuit in an inoperative state by setting the data latch circuit control signal at low level when the control signal from said latch mode change circuit is set at high level, and for setting said transfer control circuit in an inoperative state by setting the transfer control circuit control signal at low level when the control signal from said latch mode change circuit is set at low level, the data latch circuit control signal is set at high level, and the output buffer control circuit control signal is set at high level.

44. A circuit according to claim 37, wherein said latch mode change circuit outputs the control signal to said control circuit during a read operation of data stored in said memory cell by changing an internal chip enable signal so as to cause said control circuit to output a signal for controlling said transfer control circuit and said data latch circuit to be in an inoperative state.

45. A circuit according to claim 37, wherein said output buffer control circuit comprises a first NOR gate having one input terminal for receiving an internal chip enable signal and the other input for receiving an output enable control signal, a first inverter for receiving an output from said first NOR gate, a second NOR gate having an input terminal for receiving an output from said first inverter and the other input terminal for receiving the control signal from said latch mode change circuit, a first NAND gate for receiving an output from said second NOR gate through one input terminal thereof and generating an output as the output from said output buffer control circuit, a second inverter for inverting the output from said NAND gate, and a second NAND gate, having one input terminal for receiving the output from said first NAND gate and the other input terminal for receiving the output buffer control signal from said control circuit, for outputting an output to the other input terminal of said first NAND gate.

46. A semiconductor integrated circuit comprising:
data storage means;
pulse signal generating means for detecting a change in an address input and generating a pulse signal;
data detecting means for detecting data stored in said data storage means corresponding to the address input;
data transfer means for transferring the data detected by said data detecting means to data output means;
said data output means for externally outputting the data from said data transfer means; and
control means for controlling a response time of said data transfer means by using the pulse signal.

47. A circuit according to claim 46, further comprising a noise canceller, arranged between an address input terminal and said pulse signal generating means, for absorbing noise superposed on the address input from said address input terminal.

48. A circuit according to claim 46, wherein said data transfer means comprises a switch element to be closed when the data detected by said data detecting means is transferred to said data output means and opened after the data is transferred to said data output means and a delay circuit connected in parallel with said switch element.

49. A circuit according to claim 48, wherein said delay circuit comprises an integration circuit consisting of a resistive element and a capacitive element.

50. A circuit according to claim 48, wherein said delay circuit is a MOS transistor and said switch element is a MOS transistor.

51. A circuit according to claim 48, wherein said data transfer control means comprises a CMOS inverter for inverting the detection data from said data detecting means, a first CMOS inverter for inverting an output from said CMOS inverter, a second CMOS inverter for inverting an output from said first CMOS inverter, a third CMOS inverter for inverting an output from said second CMOS inverter, a first CMOS logic circuit which is operated to invert an output from said third CMOS inverter only when the signal obtained by a pulse width detecting means is set at "H" level, a first capacitor connected between a first common output node of said CMOS logic circuit and said third CMOS inverter and a ground voltage, a fourth CMOS inverter for receiving a signal from the first common output node, a second CMOS logic circuit which is operated to invert the output from said first CMOS inverter only when the signal obtained by said pulse width detecting means is set at "H" level, a second capacitor connected between a second common output node of said second CMOS logic circuit and said fourth CMOS inverter and said ground voltage, and a fifth CMOS inverter for receiving a signal from the second common output node.

* * * * *